United States Patent
Marutani

(10) Patent No.: US 9,812,622 B2
(45) Date of Patent: Nov. 7, 2017

(54) LIGHT EMITTING ELEMENT WITH LIGHT TRANSMISSIVE SUBSTRATE HAVING RECESS IN CROSS-SECTIONAL PLANE

(71) Applicant: NICHIA CORPORATION, Anan-shi, Tokushima (JP)

(72) Inventor: Yukitoshi Marutani, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 15/153,465

(22) Filed: May 12, 2016

(65) Prior Publication Data

US 2016/0336496 A1 Nov. 17, 2016

(30) Foreign Application Priority Data

May 13, 2015 (JP) .................. 2015-097921

(51) Int. Cl.

| | |
|---|---|
| *H01L 29/22* | (2006.01) |
| *H01L 33/60* | (2010.01) |
| *F21V 8/00* | (2006.01) |
| *H01L 33/58* | (2010.01) |
| *H01L 33/46* | (2010.01) |

(52) U.S. Cl.
CPC ............ *H01L 33/60* (2013.01); *G02B 6/0006* (2013.01); *G02B 6/0073* (2013.01); *H01L 33/58* (2013.01); *H01L 33/46* (2013.01)

(58) Field of Classification Search
CPC ......... H01L 33/60; H01L 33/58; H01L 33/62; H01L 2224/48091; H01L 2933/0058
USPC .................................................... 257/79, 98
See application file for complete search history.

(56) References Cited

U.S. PATENT DOCUMENTS

| | | | | |
|---|---|---|---|---|
| 5,665,985 A | | 9/1997 | Iwata | |
| 5,869,848 A | * | 2/1999 | Nobori | ................ H01L 33/0008 257/95 |
| 7,465,959 B2 | * | 12/2008 | Sugawara | ............... H01L 33/20 257/95 |
| 2004/0026700 A1 | * | 2/2004 | Akaike | ................... H01L 33/20 257/79 |
| 2005/0119441 A1 | * | 6/2005 | Ikeda | ..................... C08G 64/06 528/196 |

(Continued)

FOREIGN PATENT DOCUMENTS

| | | |
|---|---|---|
| JP | 05-347429 A | 12/1993 |
| JP | 07-202263 A | 8/1995 |

(Continued)

*Primary Examiner* — Andy Huynh
(74) *Attorney, Agent, or Firm* — Global IP Counselors, LLP

(57) ABSTRACT

A light-emitting element includes: a light transmissive substrate having a first main surface, a second main surfaces, a first lateral surface, a second lateral surface, a third lateral surface, and a fourth lateral surface; a semiconductor layered body; a first light reflection member; and a second light reflection member. A cross-sectional plane of the light transmissive substrate perpendicular to the first main surface and intersecting with the third lateral surface and the fourth lateral surface has a first concave figure having a first recess. The deepest portion of the first recess is arranged on an inner side of an outer periphery of the semiconductor layered body. The third lateral surface includes one or more surfaces defining the first recess.

15 Claims, 26 Drawing Sheets

(56) References Cited

U.S. PATENT DOCUMENTS

2005/0253157 A1* 11/2005 Ohashi .................. H01L 33/22
                                                             257/95
2006/0197094 A1    9/2006 Sugawara
2015/0137152 A1    5/2015 Marutani
2015/0207297 A1    7/2015 Fukaya

FOREIGN PATENT DOCUMENTS

| JP | 2006-245380 A | 9/2006 |
| JP | 2010-080719 A | 4/2010 |
| JP | 2012-028444 A | 2/2012 |
| JP | 2015-097234 A | 5/2015 |
| JP | 2015-138815 A | 7/2015 |

* cited by examiner

LIGHT EMITTING ELEMENT WITH LIGHT TRANSMISSIVE SUBSTRATE HAVING RECESS IN CROSS-SECTIONAL PLANE

CROSS-REFERENCE TO RELATED APPLICATION

The present application claims priority to Japanese Patent Application No. 2015-097921, filed on May 13, 2015, which is incorporated by reference in its entirety.

BACKGROUND OF THE INVENTION

1. Field of the Invention

The present disclosure relates to a light-emitting element.

2. Description of Related Art

In recent years, backlight units for liquid crystal display devices are required to be thin. Also, edge-emission type light-emitting elements, which are light sources for the backlight units, are strongly required to be small and/or thin. Further, in addition to the reduction in size and thickness, light extraction efficiency of the light emitting elements is strongly desired to be high. For this purpose, a light-emitting element in which a recess is formed in the lateral surface of a semiconductor layered structure has been proposed (for example, see Japanese Unexamined Patent Application Publication No. 1995-202263). Also, in place of utilizing light emitted from the upper surface of the light-emitting element, utilization of light emitting from the lateral surface of the light-emitting element has been proposed (for example, see Japanese Unexamined Patent Application Publication No. 2006-245380).

However, for some specific uses, the light-emitting elements in which directivity with respect to the specific directions is further increased without using optical members such as lenses, in addition to having further high light extracting efficiency. For example, in the case of using a light guide plate in the backlight unit for the liquid crystal display device and the light sources are arranged on the lateral surface of the light guide plate, it is preferable that the liquid crystal display device have a narrow frame, and it is preferable that the number of light-emitting elements be small so as to reduce the cost of the light sources. For these uses, it is desirable to omit the optical members such as lenses in the backlight unit, and the light-emitting elements having such light distribution characteristics that allows good coupling efficiency between the light from the light-emitting elements and the light guiding plate is required.

It is an object of the present invention to provide a light-emitting element that achieves a high light extraction efficiency and control of directivity.

SUMMARY (1) A light-emitting element includes: a light transmissive substrate having a first main surface, a second main surface opposite to the first main surface, a first lateral surface adjacent to the first main surface and the second main surface, a second lateral surface opposite to the first lateral surface, a third lateral surface adjacent to the second lateral surface, and a fourth lateral surface opposite to the third lateral surface; a semiconductor layered body formed on the first main surface of the light transmissive substrate; a first light reflecting member covering the first lateral surface, the second lateral surface, the fourth lateral surface, and the second main surface of the light transmissive substrate; and a second light reflecting member covering a surface of the semiconductor layered body that is opposite from a surface on which the light transmissive substrate is disposed. A cross-sectional plane of the light transmissive substrate that is perpendicular to the first main surface and intersects with the third lateral surface and the fourth lateral surface has a first concave figure having a first recess. The deepest portion of the first recess is arranged on an inner side of an outer periphery of the semiconductor layered body. The third lateral surface includes one or more surfaces defining the first recess.

(2) A light-emitting element includes: a light transmissive substrate having a first main surface, a second main surface opposite to the first main surface, a first lateral surface adjacent to the first main surface and the second main surface, a second lateral surface opposite to the first lateral surface, a third lateral surface adjacent to the second lateral surface, and a fourth lateral surface opposite to the third lateral surface; a semiconductor layered body formed on the first main surface of the light transmissive substrate; a first light reflecting member covering the first lateral surface, the second lateral surface, the fourth lateral surface, and the second main surface of the light transmissive substrate; and a second light reflecting member covering a surface of the semiconductor layered body that is opposite from a surface on which the light transmissive substrate is disposed. A cross-sectional plane of the light transmissive substrate parallel to the first main surface has a third concave figure that includes a third recess. The third lateral surface includes one or more surfaces defining the third recess.

(3) A light-emitting element in which a plurality of light emitting units are stacked, each of which includes a light transmissive substrate and a semiconductor layered body. The light-emitting element includes a first main surface, a second main surface opposite to the first main surface, a first lateral surface adjacent to the first main surface, a second lateral surface opposite to the first lateral surface, a third lateral surface adjacent to the second lateral surface, and a fourth lateral surface opposite to the third lateral surface. The first lateral surface, the second lateral surface, the fourth lateral surface, and the first main surface of the light-emitting element are covered by a first light reflecting member. The second main surface is covered by a second light reflecting member. A cross-sectional plane of the light-emitting element parallel to the first main surface of the light-emitting element has a third concave figure having a third recess. The third lateral surface includes one or more surfaces defining the third recess.

According to embodiments of the present invention, a light-emitting element that achieves high light extracting efficiency and control of directivity can be obtained.

DETAILED DESCRIPTION OF EMBODIMENTS

In the description below, embodiments of the present invention will be described appropriately referring to drawings. However, an illustration of a light-emitting element described below are intended as illustrative to give a concrete form to technical ideas of the present invention, and unless otherwise specified, the scope of the present invention is not limited to descriptions below. Also, description in one embodiment and in one example can be applied in other embodiments and examples. The sizes or positional relationships of members illustrated in each drawing may be exaggerated so as to clarify the description.

Figure 1A:
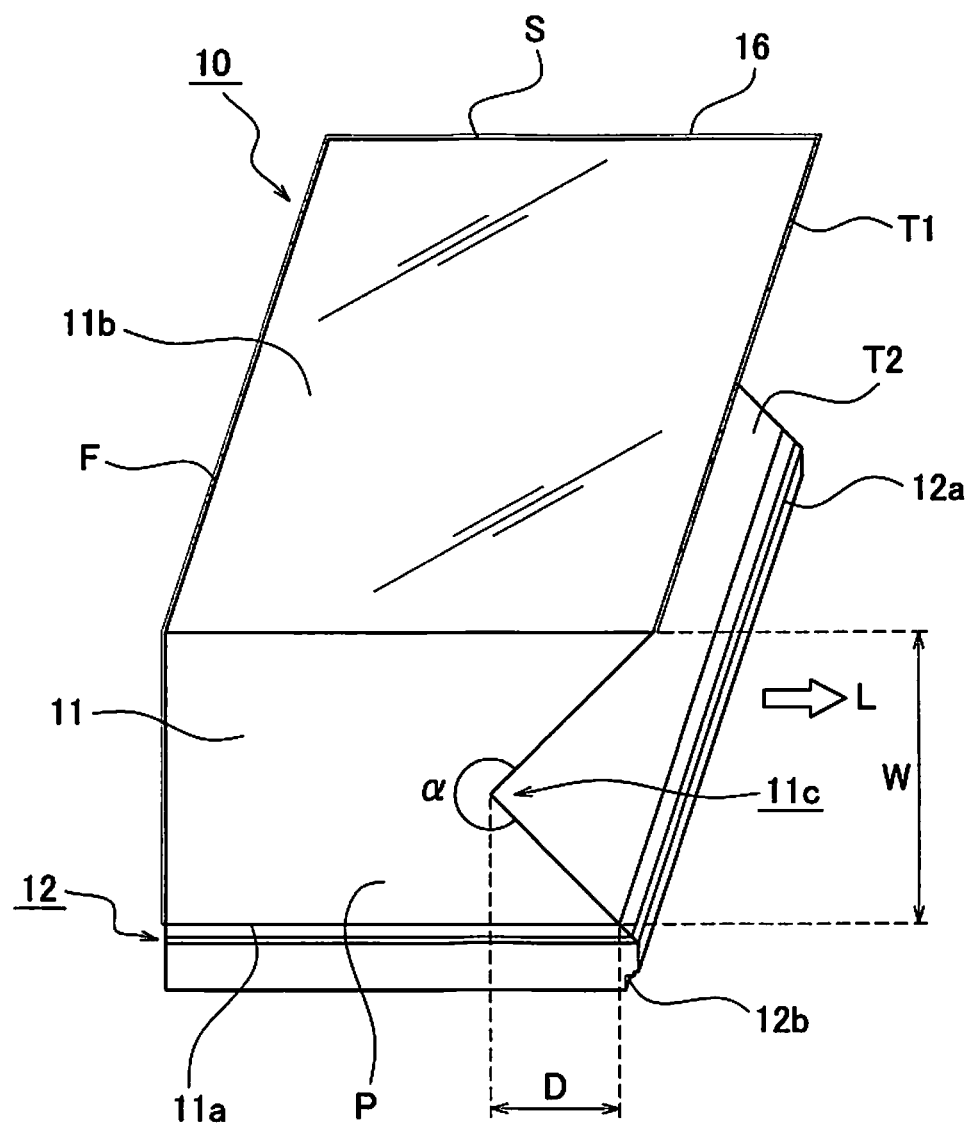
FIG. 1A is a schematic perspective view of a light-emitting element according to a first embodiment of the present invention.

A light-emitting element according to one embodiment of the present disclosure includes a light transmissive substrate, a semiconductor layered body, a first light reflecting member, and a second light reflecting member. For example, as illustrated in FIG. 1A, a light transmissive substrate 11 has a first main surface 11a, a second main surface 11b opposite to the first main surface 11a, a first lateral surface P adjacent to the first main surface 11a and the second main surface 11b, a second lateral surface S opposite to the first lateral surface P, third lateral surface T1 and T2 adjacent to the second lateral surface S, and a fourth lateral surface F opposite to the third lateral surface T1 and T2. Also, in the light transmissive substrate 11, a cross-sectional plane perpendicular to the first main surface 11a and intersecting with the third lateral surface T1 and T2 and the fourth lateral surface F is a first concave figure that includes a first recess 11c. The deepest portion of the first recess 11c is arranged on the inner side of a periphery of a semiconductor layered body 12. The third lateral surface T1 and T2 includes one or more surfaces defining the first recess 11c. The semiconductor layered body 12 is formed on the first main surface 11a of the light transmissive substrate 11. The first light reflecting member covers the first lateral surface P, the second lateral surface S, the fourth lateral surface F, and the second main surface 11b of the light transmissive substrate 11. The second light reflecting member covers a surface of the semiconductor layered body 12 that is on a side opposite to a side of the light transmissive substrate 11. The light-emitting element according to the present embodiment is referred to as a light-emitting diode and is advantageous for use in what is called chip size package (CSP). Also, directivity of light emitted from the light-emitting element can be controlled singly by the light emitting element, so that using the light emitting element in a CSP allows the size of a light-emitting device to be reduced, and allows the directivity of light emitted from the light emitting element to be controlled.

Light Transmissive Substrate

The light transmissive substrate includes a first main surface, a second main surface, a first lateral surface, a second lateral surface, a third lateral surface, and a fourth lateral surface. The second main surface is a main surface opposite to the first main surface. The first lateral surface is a surface adjacent to the first main surface and the second main surface, and the second lateral surface is a surface opposite to the first lateral surface, and the third lateral surface is a surface adjacent to the second lateral surface, and the fourth lateral surface is a surface opposite to the third lateral surface. Connecting sections in which the main surfaces and/or lateral surfaces are connected may be rounded or the like.

It is preferable that the light transmissive substrate be a member that allows 60 percent or more of light emitted from the light-emitting element to penetrate, further, it is more preferable that the light transmissive substrate be a member that allows 70 percent or more, 80 percent or more, or 90 percent or more of the light to penetrate. The light transmissive substrate having such light-transmissivity may be made of a material suitable for the epitaxial growth of the semiconductor layered body, which is described later, or may be made of a material that can support the semiconductor layered body having a known layered structure. It is preferable that the refractive index of the light transmissive substrate be close to the refractive index of a semiconductor that constitutes the semiconductor layered body because materials having such refractive index can reduce light-reflection on an interface between the semiconductor layered body and the substrate. More specifically, conductive substrates such as a nitride semiconductor (GaN, AlN, or the like), $Ga_2O_3$, ZnO, $ZrO_2$, GaAs, GaP, Si, or SiC may be employed, or substrates having insulation properties such as sapphire or spinel may be employed. In the case where the semiconductor layered body (in particular, active layer) is made of GaN-based semiconductors, it is preferable that the nitride semiconductor (GaN or the like), $Ga_2O_3$, SiC, or sapphire be employed. The light transmissive substrate may have an appropriate thickness, and for example may be in a range of approximately 100 to 500 μm.

First Main Surface and Second Main Surface

In the light transmissive substrate, a surface on which the semiconductor layered body is to be grown serves as the first main surface. The first main surface and/or the second main surface, for example, may be any one of C-plane, A-plane, and R-plane. The first main surface and/or the second main surface may have a plurality of protrusions or irregularities on the surfaces thereof. The first main surface and/or the second main surface may have an off angle of approximately 0 to 10 degrees with respect to a predetermined crystal plane such as C-plane, A-plane, or R-plane. The first main surface and/or the second main surface do not necessarily include the same crystal plane, but it is preferable that the crystal planes be parallel to each other.

The shapes of the first main surface and/or the second main surface may be different from each other, but it is preferable that the shapes be equal or approximately equal. For example, the first main surface and/or the second main surface can have an appropriate shape that corresponds to the shape of the light-emitting element to be obtained, and the shape may be, in a plan view, a circle, an ellipse, a polygon having a three or more corners, a shape in which corners of such polygon are rounded, or a shape in which a side of such polygon is curved so as to be depressed inward or projected outward.

Figure 2A:
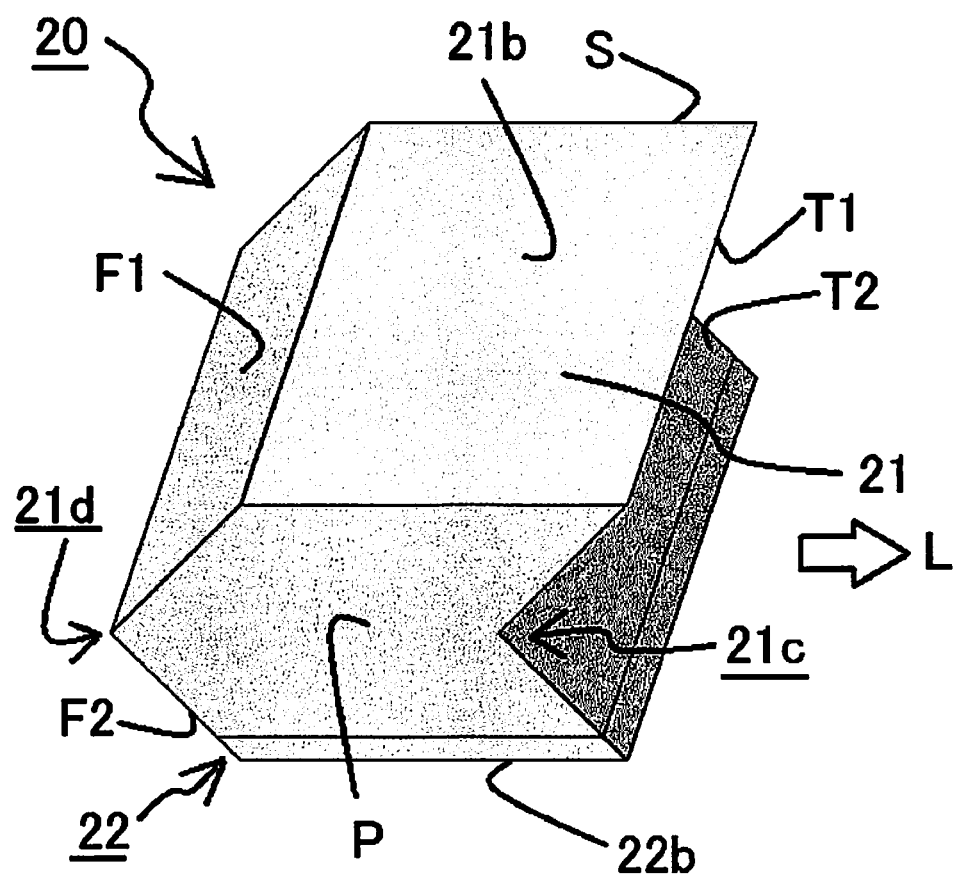
FIG. 2A is a schematic perspective view of the light-emitting element according to a second embodiment of the present invention.
Figure 4A:
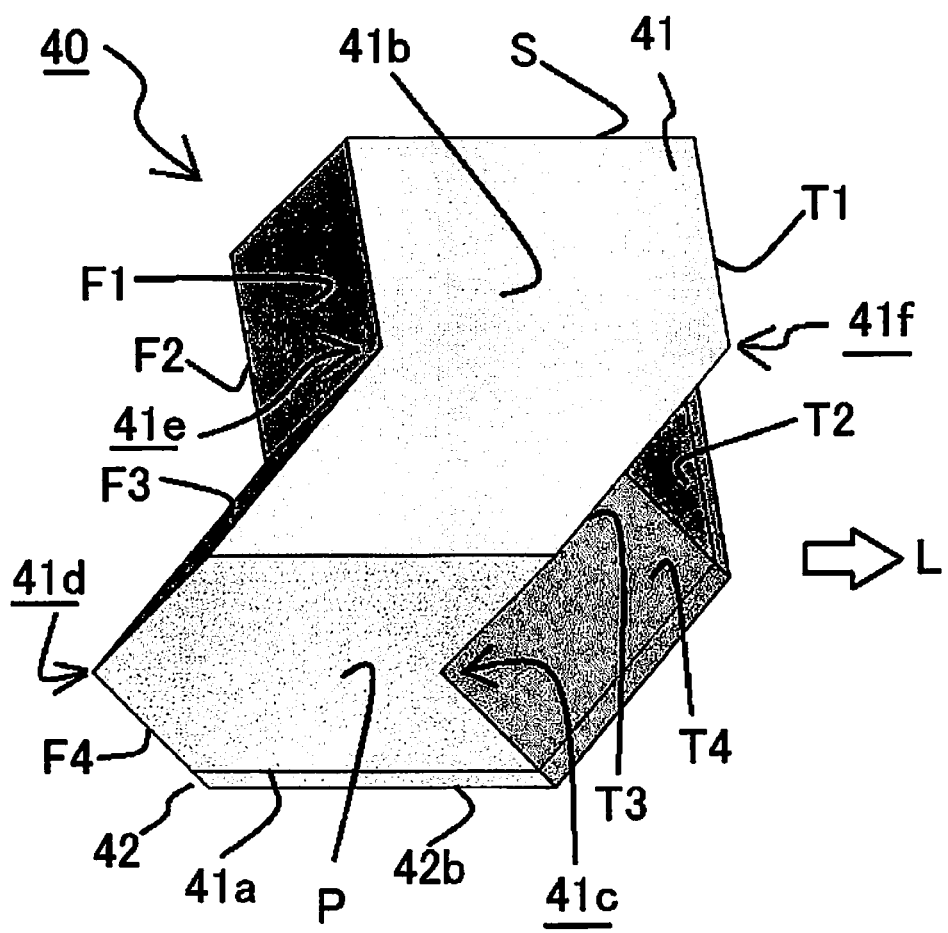
FIG. 4A is a schematic perspective view of the light-emitting element according to a fourth embodiment of the present invention.
Figure 6:
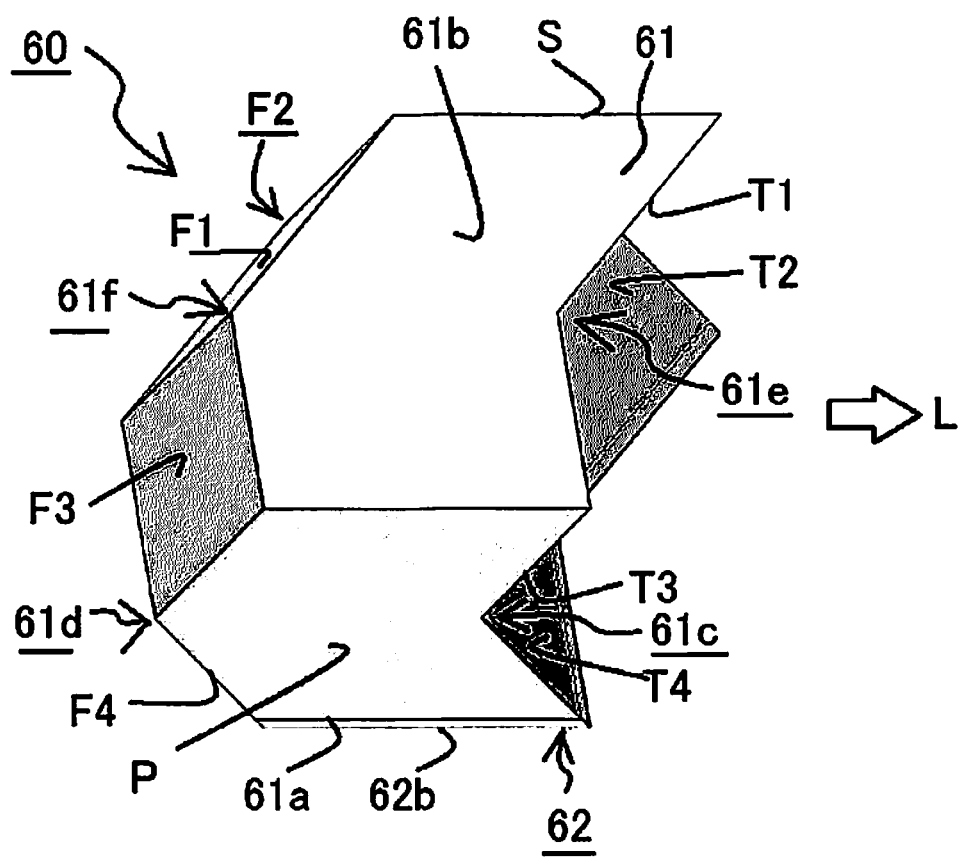
FIG. 6 is a schematic perspective view of the light-emitting element according to a sixth embodiment of the present invention.
Figure 8:
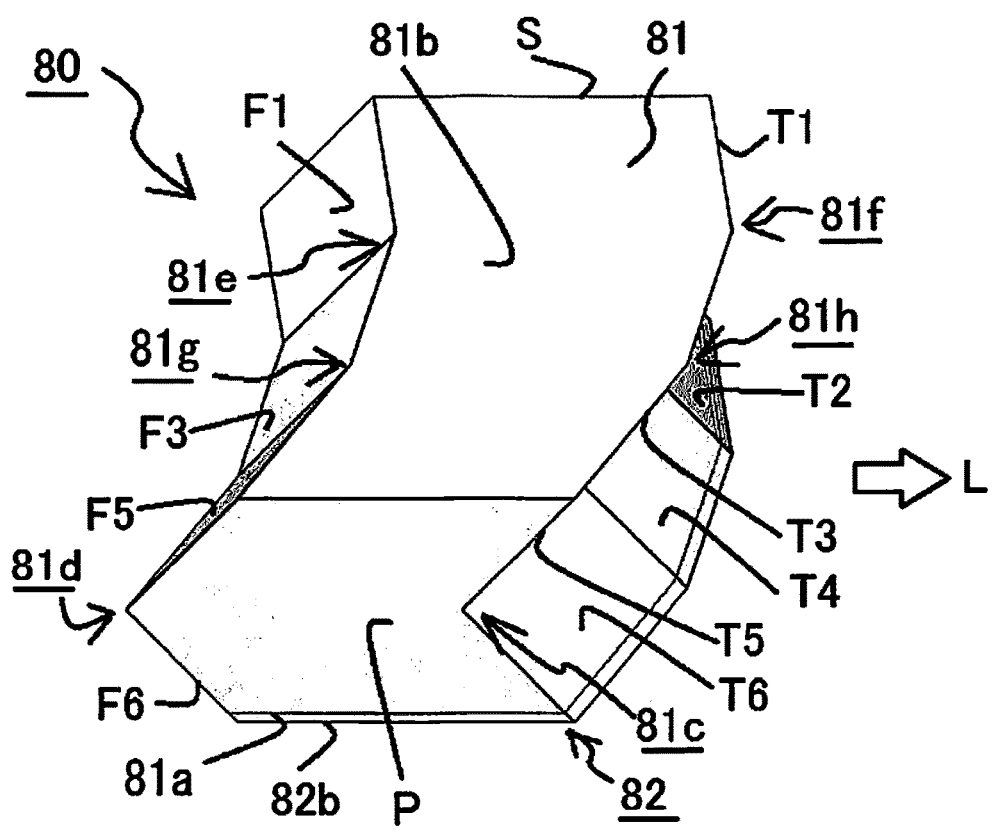
FIG. 8 is a schematic perspective view of the light-emitting element according to an eighth embodiment of the present invention.
Figure 10:
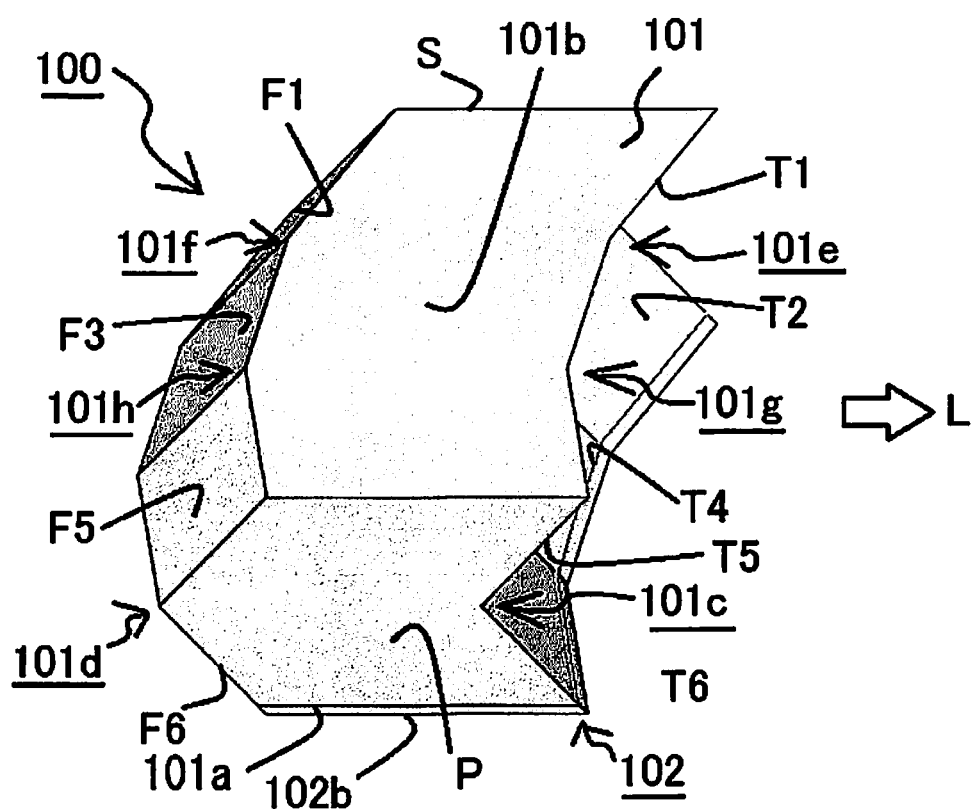
FIG. 10 is a schematic perspective view of the light-emitting element according to a tenth embodiment of the present invention.
Figure 14:
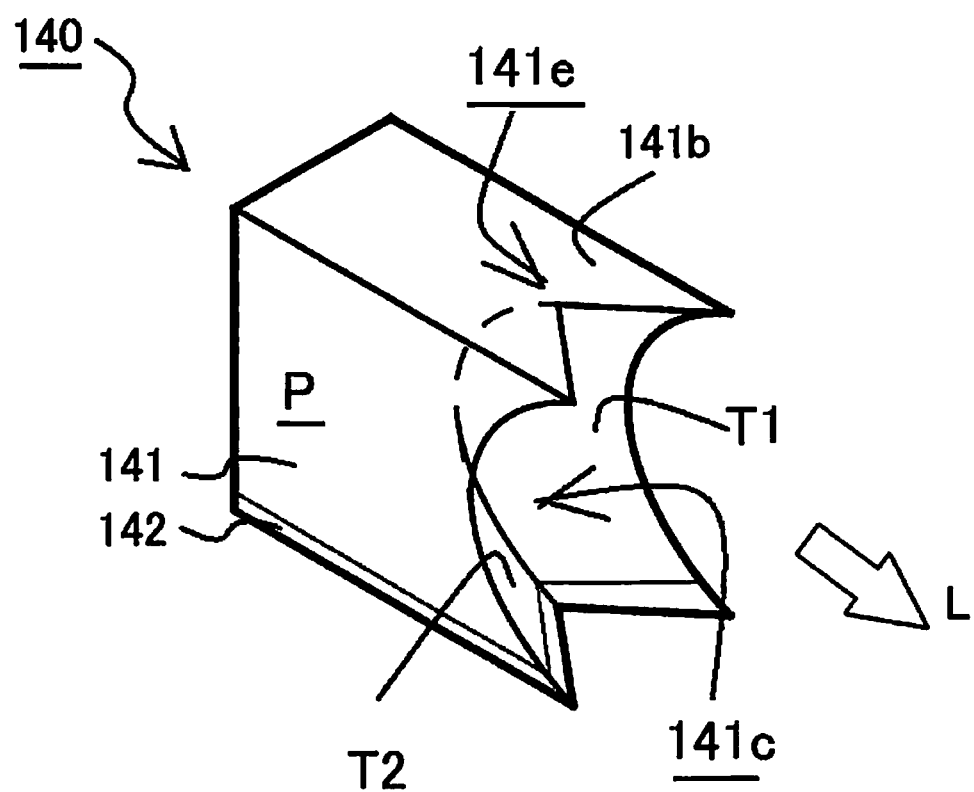
FIG. 14 is a schematic perspective view of the light-emitting element according to a fourteenth embodiment of the present invention.
Figure 15:
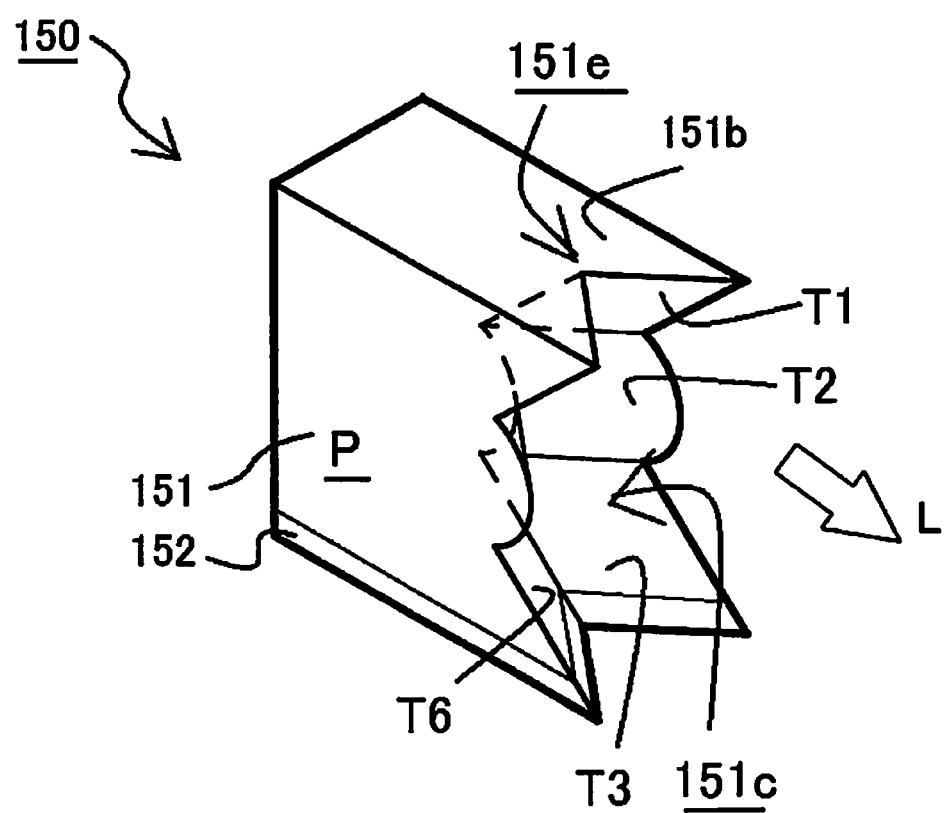
FIG. 15 is a schematic perspective view of the light-emitting element according to a fifteenth embodiment of the present invention.

Example of the shape of the first main surface and/or the second main surface includes, a quadrangle as illustrated in FIGS. 1A and 2A, a hexagon as illustrated in FIGS. 4A and 6, an octagon as illustrated in FIGS. 8 and 10, and a pentagon as illustrated in FIGS. 14 and 15, in a plan view. Peripheries defining these shapes (figures) may include a curve.

It is preferable that a cross-sectional plane parallel to the first main surface be a concave figure having one or more recesses (in the description below, these recesses are also referred to as "second recess" or "third recess" such as a second recess 41e in FIG. 4A and FIG. 5, a second recess 101e and 101g in FIG. 10, and a third recess 180j in FIG. 18). The concave figures are figures having a concave portion, and examples thereof include a concave polygon. In the description below, the concave figures may be referred to as a second concave figure or a third concave figure. In the present specification, the term "recess" basically indicates a corner having one or more re-entrant angles and two sides that defines the re-entrant angle, or a portion approximate to the corner having a re-entrant angle (e.g. a depressed curve or the like). In the case where the recess is a corner having a re-entrant angle, examples of the recess includes a corner in which an angle of the inner side of the corner is larger than 180 degrees, e.g., 240 to 300 degrees. In the case where the recess is a portion approximate to a corner having a re-entrant angle, that is, for example, in the case where the recess includes a curve, examples of the recess includes a curve in which two tangent lines to the curve constituting the recess intersect at an inner angle of larger than 180 degrees, for example, in a range of 240 to 300 degrees. Also, it is preferable that a width of the recess (a distance from an end portion of the recess on a first lateral surface side to an end portion of the recess on a second lateral surface side) be 30 to 100 percent, more preferably, 50 to 100 percent of the width (a distance from a first lateral surface of the light transmissive substrate to a second lateral surface of the light transmissive substrate) of the light transmissive substrate. With the second recess of the light transmissive substrate, for example, light distribution in the right-and-left direction of the first main surface, that is, a direction intersecting with the first lateral surface and the second lateral surface can be controlled.

It is preferable that the deepest portion of the second recess have, for example, a depth of 28 to 86 percent, more preferably, 30 to 80 percent of the width of the light transmissive substrate from a periphery of a convex hull (i.e., the minimum convex figure including a target figure; i.e., the minimum circumscribed convex figure) of the second concave figure. The term "the convex hull of the second concave figure" is referred to as, for example, in FIG. 4A, a shape of a rubber band that is stretched around a cross-sectional shape of the light transmissive substrate that intersects with the third lateral surface and the fourth lateral surface and is perpendicular to the first main surface, and for example, in FIG. 6, a shape of a rubber band that is stretched around the cross-sectional shape of the light transmissive substrate that intersects with the third lateral surface and the fourth lateral surface and is perpendicular to the first main surface in FIG. 6.

Among them, on the first main surface and the second main surface, it is preferable that the second concave figure or the third concave figure be a shape that allows a tessellation in which multiple repetitions of the shape are closely fitted together in a planar configuration. The term "shape that allows a tessellation in which multiple repetitions of the shape are closely fitted together in a planar configuration" refers to as a shape in which, when a plurality of the same planar shapes (each corresponding to the shape of the first main surface or the shape of the second main surface) are combined, a single plane having no gap or no overlap between the planar shapes is formed. With this shape, when a light-emitting element is cut out from a wafer in which the semiconductor layered bodies described later are formed on the substrate, the wafer can be divided into the plurality of light-emitting elements so as to reduce a portion of the wafer that is not used as a portion of a light emitting element. Also, with the shape that allows a tessellation, a processing to form the concave figure and a division of the wafer into the light-emitting elements can be performed simultaneously. Accordingly, a manufacturing step of processing to form the recess can be simplified.

The shape that allows a tessellation includes a parallel hexagon that has two recesses (for example, a shape of a top view of a three-dimensional shape that is formed by combining two of light-emitting elements 140 illustrated in FIG. 14 so that surfaces opposite to the third lateral surface T1 and T2 of the two light emitting elements 140 are attached to each other), a parallel hexagon having one recess (for example, see FIGS. 2A, 4A, and 6), and a parallel octagon that has a recess having two reentrant angles or two curvatures (for example, see FIGS. 8 and 10).

The light transmissive substrate can be considered as a multiple stack of layers including cross-sectional planes parallel to the first main surface and/or the second main surface, and it is preferable that some or whole of the cross sectional planes parallel to the first main surface and/or the second main surface be of the same size or the same shape with each other, because it allows for easily performing the processing.

First Lateral Surface, Second Lateral Surface, Third Lateral Surface, and Fourth Lateral Surface It is preferable that the light transmissive substrate have lateral surfaces adjacent to the first main surface and/or the second main surface and have lateral surfaces that are connected with both of the first main surface and the second main surface. These lateral surfaces include the first lateral surface and the second lateral surface, which are opposite to each other, and the third lateral surface and the fourth lateral surface, which are opposite to each other, as described above, depending on the shape of the first main surface and the second main surface.

In the present specification, the term "opposite to" refers to as that two surfaces are not adjacent to each other but are on sides opposite to each other. Accordingly, the second lateral surface is not adjacent to the first lateral surface, and a plane extending from the second lateral surface can serve as a surface intersecting with a plane extending from the first lateral surface at an angle that is smaller than 90 degrees and larger than zero degrees or larger than −90 degrees and smaller than zero degrees. Alternatively, the plane extending from the second lateral surface can be parallel to the plane extended from the first lateral surface. In particular, it is preferable that the plane extending from the second lateral surface intersect with the first lateral surface at an angle in a range of 45 degrees to −45 degrees, more preferably, at an angle in a range of 30 degrees to −30 degrees. In the present specification, the lateral surface of the substrate or a lateral surface of the semiconductor layered body may be made of one planar shape or a plurality of planar shapes or may include a curved surface.

The first lateral surface and the second lateral surface may each be a substantially flat surface, and may be a curved surface that projects outward or depresses inward, depending on processing conditions. In particular, it is preferable that the first lateral surface and/or the second lateral surface be a flat surface, and more preferably, both surfaces are flat surfaces. It is preferable that the first lateral surface and/or the second lateral surface be perpendicular to the first main surface and/or the second main surface, and more preferably, the first lateral surface and the second lateral surface are perpendicular to the first main surface and the second main surface. That is, it is preferable that the first lateral surface and the second lateral surface be parallel to each other. It is preferable that the first lateral surface and the second lateral surface be each made of one surface.

Part or whole of each of the third lateral surface and the fourth lateral surface may be formed as a substantially flat surface or may be formed as a curved surface. It is preferable that the third lateral surface and the fourth lateral surface be adjacent to at least any one or both of the first main surface and the second main surface, but in the case where the third lateral surface and/or the fourth lateral surface is made of three or more surfaces, the third lateral surface and/or the fourth lateral surface may include a surface that is adjacent to neither the first main surface nor the second main surface.

In the case where the third lateral surface includes a curved surface, the third lateral surface may be made of one surface, but in the case where a flat surface constitutes the third lateral surface, it is preferable that the third lateral surface be made of two or more surfaces, and the third lateral surface may be made of four, six, eight, or nine surfaces. Whichever a curved surface or a flat surface constitutes the fourth lateral surface, the fourth lateral surface may be made of one surface or two or more surfaces, e.g., four, six, eight, or nine surfaces. Particularly, it is preferable that the number of the surfaces that the third lateral surface includes and the number of the surfaces that the fourth lateral surface includes be equal.

In other words, the third lateral surface and the fourth lateral surface may each be bent with respect to the direction from the first lateral surface to the second lateral surface to constitute a plurality of surfaces (see FIGS. 4 to 11), or may each be bent with respect to the direction from the first main surface to the second main surface, that is, with respect to the thickness direction to constitute a plurality of surfaces (see FIGS. 1 to 3), or may be bent with respect to both the direction from the first lateral surface to the second lateral surface and direction from the second lateral surface to the first lateral surface to constitute a plurality of surfaces (see FIGS. 4 to 11).

Further, in other words, in the case where the third lateral surface includes a plurality of surfaces, the plurality of lateral surfaces intersect with each other at an obtuse angle, a right angle, or an acute angles. The fourth lateral surface may intersect with the first main surface and/or the second main surface at an obtuse angle, a right angle, or an acute angle, or two or more lateral surfaces that constitute the fourth lateral surface may intersect with each other at an obtuse angle, a right angle, or an acute angle. In particular, it is preferable that the third lateral surface include one or more surfaces defining the first recess and the second recess described below. With this structure, light distribution with respect to the upside-to-downside direction and rightside-to-leftside direction of the light-emitting element can be narrow. It is noted that "rightside-to-leftside" direction refers to the direction intersecting with both of the first lateral surface and the second lateral surface. It is preferable that the fourth lateral surface include one or more surfaces defining the second recess described below. With this structure, light distribution with respect to the upside-to-leftside direction of the light-emitting elements can be narrow, and light distribution with respect to the rightside-to-leftside of the light-emitting elements can be broad.

It is preferable that at least one of the third lateral surface and the fourth lateral surface be adjacent to any one or both of the first lateral surface and the second lateral surface. However, in the case where the third lateral surface and/or the fourth lateral surface includes three or more surfaces, the third lateral surface and/or the fourth lateral surface may include a surface that is adjacent to neither the first main surface nor the second main surface.

A cross-sectional plane of the light transmissive substrate perpendicular to the first main surface of the light transmissive substrate and intersecting with the third lateral surface and the fourth lateral surface, for example, a cross-sectional plane in parallel to the first lateral surface and/or the second lateral surface has the first concave figure including one or more first recesses (for example, 11c in FIG. 1). The first recess can be the similar to the second recess described above. Basically, the first recess refers to a corner having one or more re-entrant angles or a portion approximate to this. In the case where the first recess is a corner having a re-entrant angle, the corner has an angle of larger than 180 degrees, for example, in a range of 240 to 300 degrees on the inner side of the corner. In the case where the first recess is a portion approximate to a corner having a re-entrant angle, for example, in the case where the first recess is made of a curve, examples of the recess includes a curve in which two tangent lines to the curve constituting the recess intersect at an inner angle of larger than 180 degrees, for example, in a range of 240 to 300 degrees. Also, it is preferable that a width of the recess (a distance from an end portion of the recess on a first lateral surface side to an end portion of the recess on a second lateral surface side) be 30 to 100 percent, more preferably, 50 to 100 percent of the width (a distance from a first lateral surface of the light transmissive substrate to a second lateral surface of the light transmissive substrate) of the light transmissive substrate.

Among them, in a cross-sectional plane perpendicular to the first main surface and intersecting with the third lateral surface and the fourth lateral surface, it is preferable that the first concave figure be a shape that allows a tessellation in which multiple repetitions of the shape are closely fitted together in a planar configuration. With this shape, when a light-emitting element is cut out from a wafer in which the semiconductor layered bodies described later are formed on the substrate, the wafer can be divided into the plurality of light-emitting elements so as to reduce a portion of the wafer that is not used as a portion of a light emitting element.

The shape that allows a tessellation includes a parallel hexagon that has a recess having two re-entrant angles or two curvatures, a parallel hexagon having one recess (for example, see FIGS. 2A, 4A, and 6), and a parallel octagon that has a recess having two re-entrant angles or two curvatures (for example, see FIGS. 8 and 10). In order to form a shape that allows a tessellation, it is preferable that the number of the first recess formed by the third lateral surface be one. In the case where the number of the first recess is one, in addition to that a processing to form the recess can be easy, the light distribution can be unipolar, that is, the light distribution characteristics in which one peak of light emission intensity exists can be obtained. Accordingly, in the case where the light-emitting elements are used with the light guiding plate, the positions of the light guiding plate can be adjusted in accordance with one peak of light emission intensity, which can facilitate the alignment of the light guiding plate.

That is, the third lateral surface and the fourth lateral surface may be not necessarily in parallel to each other, but it is preferable that one surface of the third lateral surface and one surface of the fourth lateral surface be in parallel to each other, and more preferably, all the surfaces of are in parallel to each other. All the surfaces of the third lateral surface and the fourth lateral surface being in parallel to each other, as described above, allows for realizing the shape that allows a tessellation. Such shape can facilitate combination of the plurality of light-emitting elements.

When the deepest portion of the first recess is viewed from a side of the semiconductor layered body described below, the deepest portion is on the inner side of the semiconductor layered body, in particular, on the inner side of a periphery of the active layer. It is preferable that the deepest portion, for example, have a depth of 28 to 86 percent, more preferably, 30 to 80 percent of the thickness of the light transmissive substrate, from the outermost section on the third lateral surface.

In the case where the third lateral surface includes a plurality of surfaces, a first main surface-side and a second main surface-side are mutually symmetrical or asymmetrical with respect to a cross-sectional plane parallel to the first main surface that is in the middle of the lateral surfaces that constitute the third lateral surface. Also, in the case where the third lateral surface includes the second recess, the third lateral surface may be arranged such that a lateral surface of the third lateral surface on the first lateral surface side and a lateral surface of the third lateral surface on the second lateral surface side are mutually symmetrical or asymmetrical with respect to a cross-sectional plane that is in the middle of the lateral surfaces that constitute the third lateral surface, perpendicular to the first main surface, and intersected with the third lateral surface and the fourth lateral surface. The fourth lateral surface is similar to this. With these lateral surfaces of the third lateral surface being symmetrical or asymmetrical, the light distribution with respect to a desired direction such as an upper side, a lower side, a left side, and a right side (the first main surface side, the second main surface side, the first lateral surface side, and the second lateral surface side) can be easily controlled, so that the applicability of the light-emitting elements can be extended.

The light transmissive substrate can be considered as a multiple stack of layers including cross-sectional planes perpendicular to the first main surface and intersecting with the third lateral surface and the fourth lateral surface, such as a cross-sectional plane parallel to the first lateral surface and/or the second lateral surface, and it is preferable that a part or whole of the cross-sectional planes parallel to the first lateral surface and/or the second lateral surface be of the same size and shape.

One of the third lateral surface or the fourth lateral surface of the light transmissive substrate serves as light extraction surfaces of the light-emitting element, and the other serves as light reflection surfaces of the light-emitting element. For example, in certain embodiments, the third lateral surface serves as the light extraction surfaces. Accordingly, one of various advancing directions of light emitted from the third lateral surface corresponds to a light extracting direction. The third lateral surface can be roughened, which can reduce total reflection of light emitted from the inside of the substrate and further can perform light diffusion. Roughing of the third surface can be performed by roughing the surface or applying a powder to a light extraction surface at the time of the processing such as cutting out the light emitting element.

Between the light transmissive substrate and the semiconductor layered body described below, the light emitting element may include semiconductor layers such as an intermediate layer, a buffer layer, and a base layer, a conductive layer, or an insulating layer.

Semiconductor Layered Body

The semiconductor layered body is made of a plurality of semiconductor layers formed on the first main surface of the light transmissive substrate. As described above, a growth substrate for growing semiconductor layers may be removed from the semiconductor layered body. In the present specification, as for the semiconductor layered body, a surface of the semiconductor layered body closer to the light transmissive substrate may be referred to as a lower surface, and a surface of the semiconductor layered body farther from the light transmissive substrate may be referred to as an upper surface. The lower surface of the semiconductor layered body is usually in contact with or opposite to the first main surface of the light transmissive substrate.

Examples of materials for the semiconductor layers includes elements having semiconductor properties such as silicon and germanium and compound semiconductors such as III-V compound semiconductors. For example, the semiconductor layer can be a layered body including a first semiconductor layer, a light emission layer (active layer), and a second semiconductor layer which are made of gallium nitride based semiconductors (for example, $In_XAl_YGa_{1-X-Y}N$ ($0 \leq X$, $0 \leq Y$, $X+Y \leq 1$) or the like), II-IV or III-V semiconductors, or the like. Specifically, InN, AlN, GaN, InGaN, AlGaN, InGaAlN, or the like can be employed. A thickness and structure of each layer that are known in this field can be employed. In these semiconductor layers, each layer may have a single layer structure, may have a layered structure in which layers having different composition or thicknesses are layered, or may have superlattice structure may be applied. In particular, it is preferable that the light emission layer have a single quantum well structure or a multiple quantum well structure in which thin films having a quantum effect are layered. Each of the semiconductor layers and the semiconductor layered body may have an appropriate thickness, but the thicknesses known in this field can be employed.

Shape of Semiconductor Layered Body

After the semiconductor layered body is formed or arranged on the light transmissive substrate, a protective film is usually formed after singulating the wafer into the light emitting elements (i.e., cutting into chips) on the semiconductor layered body in order to protect the first semiconductor layer of a first conductive type, the active layer, and the second semiconductor layer of a second conductive type so as not to be exposed, so that a portion or whole of the semiconductor layered body in the thickness direction of the semiconductor layered body may be removed. For example, in the case where a first electrode and a second electrode are arranged on an upper surface side of the semiconductor layered body, a portion or whole of the semiconductor layered body in the thickness direction of the semiconductor layered body may be removed so as to form at least the first electrode, and/or a portion or whole of the semiconductor layered body in the thickness direction of the semiconductor layered body which corresponds to the outer circumference of the light-emitting element may be removed so as to form the light-emitting element. The first electrode may be arranged so as to be in contact with the exposed portion of the first semiconductor layer of the semiconductor layered body or may be arranged so as to contact the first semiconductor layer via the lateral surface of the first semiconductor layer. Also, in the case where the first electrode and the second electrode are arranged on the upper surface of the semiconductor layered body and the second main surface of the light transmissive substrate, respectively, it is preferable that a portion or whole of the semiconductor layered body in the thickness direction of the semiconductor layered body that corresponds to the outer circumference of the light-emitting element be removed so as to form the light-emitting element. With any shape of the semiconductor layered body, arranging the first electrode and the second electrode to be on the same surface side of the semiconductor layered body allows for obtaining the light-emitting element of a flip-chip type or a face-up type (inclusive of a wire bonding type).

Accordingly, there may be a case where a lateral surface of the semiconductor layered body, that is, a surface of the semiconductor layered body adjacent to the upper surface and the lower surface of the semiconductor layered body does not correspond to a portion or whole of the first lateral surface, the second lateral surface, the third the lateral surface, and/or the fourth lateral surface of the light transmissive substrate, that is, there may be a case where a lateral surface of the semiconductor layered body does not form the identical plane with these lateral surfaces of the light transmissive substrate. Also in this case, it is preferable that the upper surface or the lower surface of the semiconductor layered body have approximately the same shape and/or approximately the same area with the first main surface. In the present specification, the term "approximately the same shape" means that a similar figure, a difference of a degree of a straight line or a curved line, or roundness of a corner are within an allowable range, and the term "approximately the same area" means that variation of approximately plus or minus 10 percent of the dimensions of the light transmissive substrate is within an allowable range. The outermost portion of the lateral surface of the semiconductor layered body is referred to as a periphery of the semiconductor layered body. It is noted that a section where the lateral surface and the upper surface or the lower surface of the semiconductor layered body are coupled may be rounded or the like.

The semiconductor layered body preferably has a sufficiently large area when viewed from above in order to suppress the reduction in light emission efficiency due to heat caused by electric conduction. That is, it is preferable that the first main surface of the light transmissive substrate, on which the semiconductor layered body is arranged, have an area in accordance with the driving current of the light-emitting element. In view of this, it is preferable that the shape (the shape of the semiconductor layered body when it is viewed from above) of the first main surface of the light transmissive substrate, for example, be a pentagon or hexagon rather than a quadrangle, in order to secure flexibility in the design of light distribution in the direction parallel to the first main surface of the light transmissive substrate and to secure the sufficient area of the semiconductor layered body in a compatible manner. More specifically, for example, in the case where the semiconductor layered body has a shape of concave quadrilateral in a top view and two adjacent sides of the concave quadrilateral corresponds to light extraction surfaces of the semiconductor layered body, in top view, adjusting the angle of the corner (reentrant angle or salient angle) defined by the two adjacent sides corresponding to the light extraction surfaces without changing a transverse width of the semiconductor layered body and an angle of a corner opposite to the corner defined by the two adjacent sides corresponding to the light extraction surfaces may lead to change in the area of the active layer. If the area of the active layer is reduced, current density may increase, so that light emission efficiency might be reduced. In contrast, if the area of the active layer is increased, the light-emitting element increases in size, and the number of light-emitting elements obtained from a wafer is reduced, which may lead to an increase in manufacturing costs. In view of this, for example, with a shape illustrated in FIG. 4A or the like, that is, in the top view of the semiconductor layered body having a shape of parallel hexagon, changing the lengths of sides forming the first and second lateral surfaces allows for adjusting the angle of the corner formed by the sides corresponding to the light extraction surface without changing the width and an angle (reentrant angle or salient angle) of the corner opposite to the corner formed by the sides corresponding to the light extraction surface, and allows for keeping the area of the active layer in the top view to be the same.

Light Reflecting Member

As described above, the light-emitting element is of an edge-emission type, and therefore surfaces except for the lateral surfaces that serve as the light extraction surfaces of the light-emitting element are covered by the light reflecting members. That is, the light-emitting element includes a first light reflecting member that covers the first lateral surface, the second lateral surface, the fourth lateral surface, and the second main surface, and a second light reflecting member that covers a surface of the semiconductor layered body on the side opposite to the side of the light transmissive substrate. It is noted that the first light reflecting member may not be formed on the all surfaces on which the first light reflecting member to be formed in a single process, and for example, the first light reflecting member may be sputtered on the surfaces in batches multiple times. The first light reflecting member may be made of one material or a plurality of different materials. Also, the first light reflecting member may include portions that are made of different materials, have different composition, or have different layered structure, depending on surfaces to be covered; or vice versa, the materials, composition, and layered structure of the first light reflecting members that cover the entire surfaces may be the same. Alternately, it is also possible that the materials, composition, and layered structure of some portions of the first light reflecting members that cover some of a plurality of surfaces be the same while the materials, composition, and layered structure of the other portions the first light reflecting members that cover the other surfaces may each differ.

It is preferable that the reflectivity of these light reflecting members with respect to the light emitted by the light emission layer (active layer) be 60 percent or higher, more preferably, 70, 80, or 90 percent of higher. Appropriate materials can be used for the light reflecting members, but, examples of the materials include, metal, dielectric materials, resin.

Examples of metals used as a material for the light reflecting member include, a single layer and a multilayered structure made of metals such as Ti, Cr, Ni, Si, Al, Ag, Au, Pt, or Pd, an alloy of these, and metals used for a material for an electrode. Examples of the dielectric material includes, a distributed Bragg reflector (DBR) film. The DBR film, for example, has a multilayered structure in which a plurality of pairs (e.g., two to five pairs) of dielectric materials, each pair of which is made of a low refractive index layer and a high refractive index layer, are appropriately formed on the base layer made of oxide films, and serve to selectively reflect light having a predetermined wavelength. More specifically, films, each of which has a thickness of one fourth of a wavelength of emitted light and has a different refractive index, are alternately layered, so that light having a predetermined wavelength can be reflected with high efficiency. The films can be formed of materials that include an oxide or nitride of at least one material selected from a group consists of Si, Ti, Zr, Nb, Ta, and Al. For example, in the case where the DBR film is formed of oxide films, $SiO_2$ can be used for the low refractive index layer, and $Nb_2O_5$, $TiO_2$, $ZrO_2$, and $Ta_2O_5$ can be used for the high refractive index layer. Specifically, the multilayered structure of the DBR film is represented as $(Nb_2O_5/SiO_2)n$ from the base layer, in which "n" indicates the number of repetition and "n" is in a range of 2 to 5. It is preferable that the total film thickness of the DBR be in a range of approximately 0.2 to 1.0 μm.

Examples of resins used for the materials of the light reflecting member includes thermosetting resin and thermoplastic resin. More specifically, examples for such resin includes: epoxy resin composition, silicone resin composition, and modified epoxy resin composition such as silicone modified epoxy resin; modified silicone resin composition such as epoxy modified silicone resin; polyimide resin composition, modified polyimide resin composition; polyphthalamide (PPA); polycarbonate resin; polyphenylene sulfide (PPS); liquid crystal polymer (LCP); ABS resin; phenol resin; acrylic resin; and PBT resin. Usually, a light reflecting material such as titanium dioxide, silicon dioxide, zirconium dioxide, potassium titanate, alumina, aluminum nitride, boron nitride, mullite, niobium oxide, and various rare earth oxides (for example, yttrium oxide and gadolinium oxide) is added to the resin in order to make the resin light-reflective. For example, in the case where titanium dioxide is used for the light reflecting members, it is preferable that titanium dioxide of 20 to 40 wt % of the total weight of the resin be contained in the resin.

Among them, a metal is preferably used for light reflecting members. The light reflecting member may have an appropriate thickness, but it is preferable that the thickness, with which the light reflectivity can be secured, be selected. As described above, in the case where any of the first electrode and the second electrode is arranged on the second main surface of the light transmissive substrate, a member that serves both as the electrode and the light reflecting member may be arranged. It is noted that the first light reflecting member and the second light reflecting member may not be formed with the same material, the same composition, or the same layered structure, but may be formed with the same material, the same composition, or the same layered structure.

Configuration of Light-Emitting Element

The light-emitting element is of what is called an edge-emission type light emitting element. That is, light is extracted from the surface intersecting with the light emitting layer, for example, in a direction toward a lateral surface of the light emission layer, which is different from the case where the light is extracted from a surface parallel to the light emission layer of the semiconductor layered body. In accordance with this, light is extracted from the lateral surface of the light transmissive substrate, more specifically, from the third lateral surface.

The light-emitting element may include one light emitting unit, which is made of one light transmissive substrate and one semiconductor layered body that includes one active layer, or may include a plurality of light emitting units in which light transmissive substrates and semiconductor layered bodies are alternately formed. In the case where the light-emitting element include a plurality of light emitting units, the first electrode, the second electrode, and/or the protective film described above may be formed with respect to every single light emitting unit, but in view of the light absorption and miniaturization of the light-emitting element, it is preferable that the first electrode, the second electrode, and/or the protective film be formed with respect to the combined whole of the plurality of units.

In the case where the light-emitting element is the combination of the plurality of single light emitting units, each of which is made of one light transmissive substrate and one semiconductor layered body as a single unit, the first main surface and the second main surface of the light transmissive substrate described above correspond to a surface of the semiconductor layered body and a surface of the light transmissive substrate of the light-emitting element, respectively. Also, the first lateral surface P, the second lateral surface S, the third lateral surface T, and the fourth lateral surface F of the light transmissive substrate correspond to a first lateral surface Ps, a second lateral surface Ss, a third lateral surface Ts, and a fourth lateral surface Fs of the light-emitting element, respectively.

Figure 17:
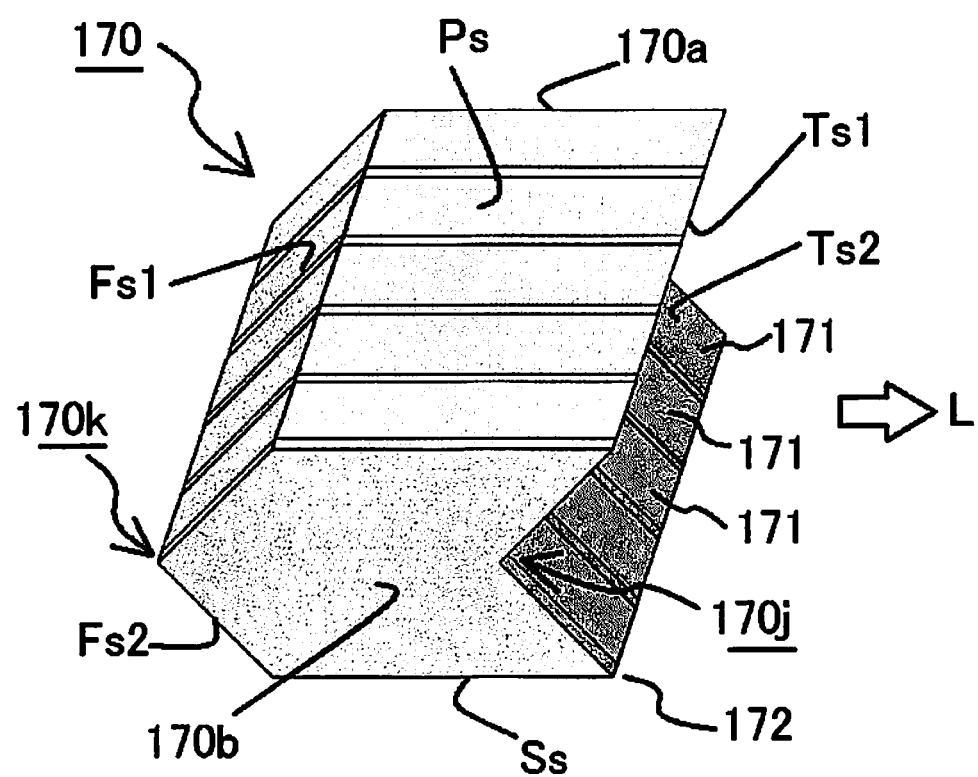
FIG. 17 is a schematic perspective view of the light-emitting element according to a seventeenth embodiment of the present invention.
Figure 18:
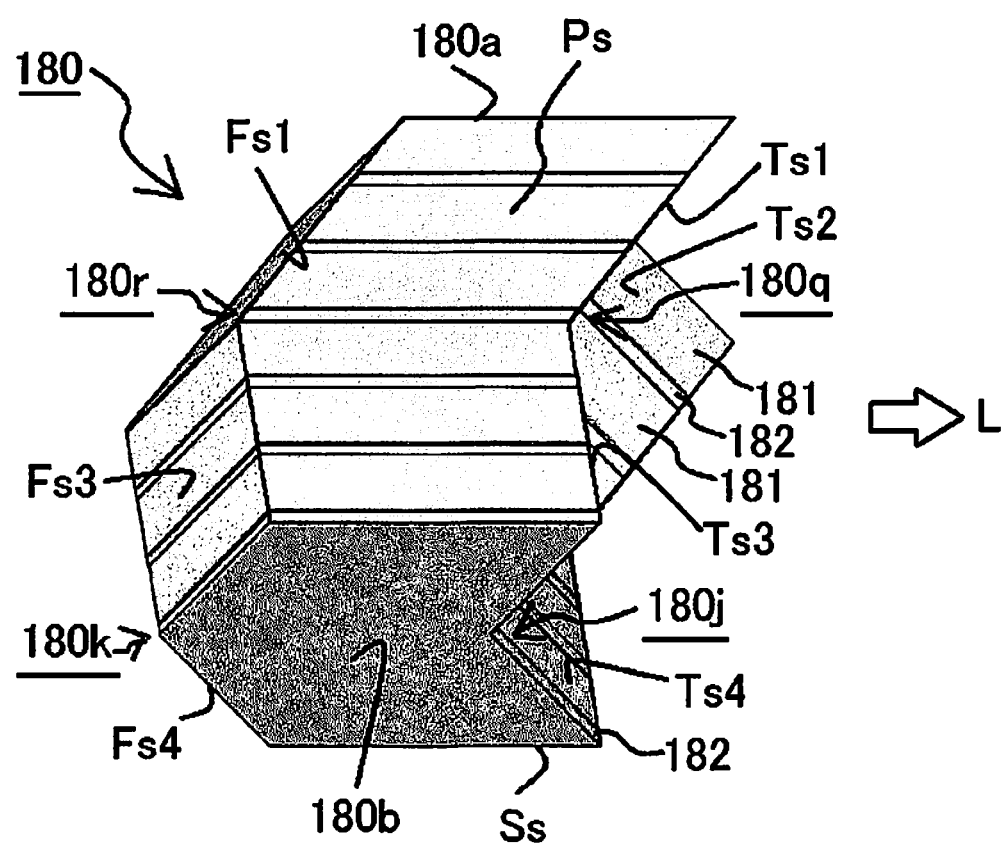
FIG. 18 is a schematic perspective view of the light-emitting element according to an eighteenth embodiment of the present invention.
Figure 19:
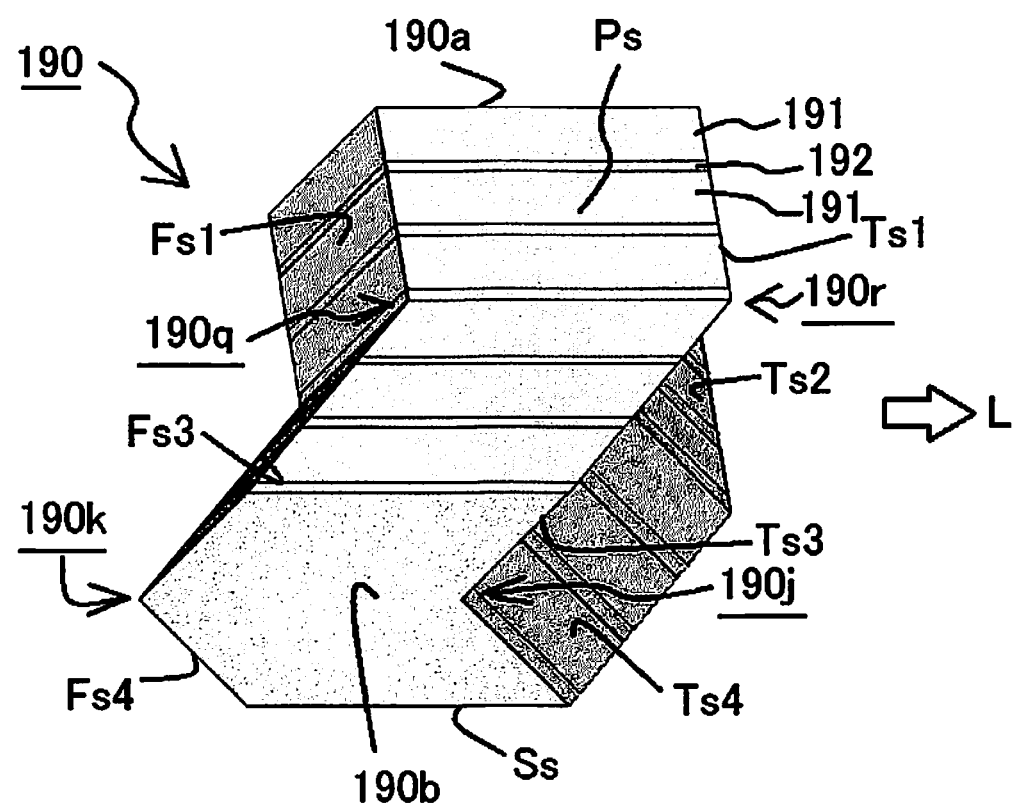
FIG. 19 is a schematic perspective view of the light-emitting element according to a nineteenth embodiment of the present invention.

As illustrated in FIGS. 17, 18, and 19, in the case of a light-emitting element in which a plurality of light emission units, each of which includes the light transmissive substrate and the semiconductor layered body, are formed, a cross-sectional plane parallel to the first main surface of the light-emitting element has the third concave figure having the third recess. The third recess in this case can be a portion similar to the second recess of the light transmissive substrate, and one or more surfaces constituting the third recess correspond to the third lateral surface Ts and serve as a light extraction surface in certain embodiments. Accordingly, the lateral surfaces except for the third lateral surface Ts, that is, the first lateral surface Ps, the second lateral surface Ss, the fourth lateral surface Fs, and the first main surface of the light emitting element are covered by the first light reflecting member, and the second main surface is covered by the second light reflecting member.

The third lateral surface (T or Ts) may be covered by a light transmissive member. It is preferable that the refractive index of the light transmissive member that covers the third lateral surface be equal to or higher than the refractive index of the light transmissive substrate, which allows the light extraction efficiency to be good. It is further preferable that the refractive index of the light transmissive member be equal to or lower than the refractive index of the light guide plate to be used with the light emitting element, and an end surface (surface facing the light guiding plate) of the light transmissive member be parallel to the opposite end surface of the light guide plate surface, which allows coupling efficiency of light with the light plate to be good.

Manufacturing of Light-Emitting Element

The light-emitting element can be formed with use of methods known in this field. In particular, after the plurality of light-emitting elements are collectively formed by a typical method on the wafer, the light transmissive substrate in the wafer is machined by laser beam machining, for example, stealth dicing using multiphoton absorption, laser ablation machining, deep groove machining by laser-induced backside wet etching method (LIBWE method), or method using laser water jet, which can realize the shape of the light-emitting elements described above. In particular, in the case of forming the curved surface, a method of irradiating a laser beam in the depth direction while shifting the position of the focal point of the laser beam using the LIBWE method can be employed.

In the present specification, small irregularities that would formed in the laser scribing to form the shape are excluded from the definition of the first recess, the second recess, and the third recess described above. Also, small irregularities formed by roughing machining are also excluded from the definition of the first recess, the second recess, and the third recess. For example, irregularities having Ry (see JIS B 0601 (1994) or JIS B 0031 (1994)) of approximately 10 μm or less, are excluded from the definition of these recesses.

After the light transmissive substrate is machined into the shape described above, an appropriate amount of phosphorous powder may optionally be applied to the light extraction surface. This can change the color of light emission of the light-emitting elements.

In the description below, the embodiment of the light-emitting element of the present invention is illustrated in detail referring to drawings.

First Embodiment

A light-emitting element 10 according to the present embodiment includes, as illustrated in FIG. 1A, for example, a light transmissive substrate 11 made of sapphire and a semiconductor layered body 12 that is layered on the light transmissive substrate 11 and includes an active layer 12a. The light transmissive substrate 11 includes a first main surface 11a and a second main surface 11b opposite to the first main surface. The first main surface 11a and the second main surface 11b, for example, are a C-plane of sapphire. The light transmissive substrate 11 has a thickness of 160 μm. The first main surface 11a and the second main surface 11b each has a rectangle shape, and all cross-sectional planes parallel to the first main surface 11a and the second main surface 11b have rectangle shapes, but approximately all the cross-sectional planes have different shapes.

The light transmissive substrate 11 has the first lateral surface P, which is one lateral surface adjacent to the first main surface 11a and the second main surface 11b. Also, the light transmissive substrate 11 has the second lateral surface S, which is a surface opposite to the first lateral surface P. The first lateral surface P and the second lateral surface S are arranged in parallel. The first lateral surface P and the second lateral surface S are perpendicular to the first main surface 11a and the second main surface 11b. All the cross-sectional planes parallel to the first lateral surface P and the second lateral surface S have the same shape with the first lateral surface P and the second lateral surface S. A cross-sectional plane perpendicular to the first main surface and intersecting with the third lateral surface and the fourth lateral surface, that is, a cross-sectional plane parallel to the first lateral surface P and the second lateral surface S, has a first concave figure including the first recess 11c. In this case, the degrees a of the interior angle of the first recess 11c are 270 degrees, and a width W is equal to the thickness of the light transmissive substrate 11, and a depth D is 80 μm.

Also, the light transmissive substrate 11 further has two surfaces T1 and T2 of the third lateral surface that exist between the first main surface 11a and the second main surface 11b and positioned between the first lateral surface P and the second lateral surface S. The third lateral surface T1 and T2 is surfaces forming the first recess 11c and bent with respect to a direction from the first main surface 11a to the second main surface 11b, that is, in the thickness direction so as to form respective surfaces. The third lateral surface T1 and T2 is arranged so as to be approximately symmetrical with respect to a cross-sectional plane that extends through the first recess 11c on the first lateral surface P and that is parallel to the first main surface 11a and the second main surface 11b. The light transmissive substrate 11 has one fourth lateral surface F opposite to the third lateral surface T1 and T2. The fourth lateral surface F is perpendicular to the first main surface 11a, the second main surface 11b, the first lateral surface P, and the second lateral surface S.

Figure 1B:
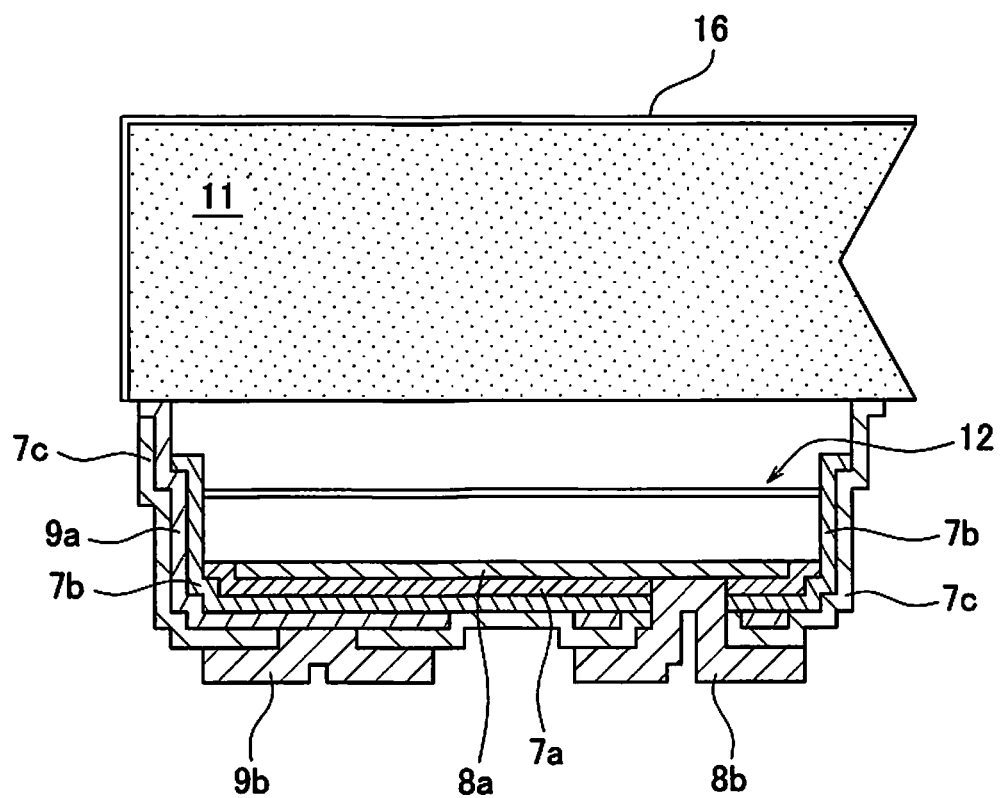
FIG. 1B is a schematic enlarged cross-sectional view of a semiconductor layered body in FIG. 1A.

As illustrated in FIG. 1B, in the semiconductor layered body 12, for example, the first semiconductor layer (e.g., Si doped n-type GaN layer having a thickness of 4.6 μm), the light emission layer (e.g., a light emission layer having multiple quantum well structure with six wells that is made of a well layer of $In_{0.3}Ga_{0.7}N$ having a thickness of 3 nm and a barrier layer of GaN having a thickness of 25 nm), and the second semiconductor layer (e.g., Mg doped p-type $Al_{0.2}Ga_{0.8}N$ having a thickness of 20 nm and Mg doped p-type GaN layer having a thickness of 0.2 μm) are layered in order from the side of the light transmissive substrate 11. Portions of the second semiconductor layer and the active layer are removed, and other portions of the second semiconductor layer, the active layer, and the first semiconductor layer are removed. As a first electrode 9a, multilayered films made of Ti/Al/Ni/Au, for example, is connected to a portion of a lateral surface of the first semiconductor layer that is exposed, and the multilayered films are further connected to a first pad electrode 9b. As a second electrode 8a, for example, a transparent conductive layer made of an indium tin oxide (ITO) having a thickness of 60 nm and a second pad electrode 8b made of layered films of Pt/Au are connected to a surface of the second semiconductor layer. Protective films 7a, 7b, and 7c cover a section between the semiconductor layered body 12 and the first electrode 9a and a section between the second electrode 8a and the first electrode 9a. Accordingly, the lateral surfaces of the semiconductor layered body 12 do not precisely correspond to the first lateral surface P, the second lateral surface S, the third lateral surface T1 and T2, and the fourth lateral surface F of the light transmissive substrate 11, but a difference between the lateral surface of the semiconductor layered body 12 and the lateral surfaces P, S, T1, T2 and F of the light transmissive substrate 11 is approximately within several micrometers or less, and therefore it is regarded that the lateral surfaces of the semiconductor layered body 12 approximately corresponds to the lateral surfaces P, S, T1, T2 and F of the light transmissive substrate 11.

In order that a light-emitting element 10 serve as an edge-emission type light-emitting element, surfaces except for the light extraction surfaces, that is, surfaces except for the third lateral surface T1 and T2, serve as light reflection surfaces. That is, the first lateral surface P, the second lateral surface S, the fourth lateral surface F, and the second main surface 11b of the light transmissive substrate 11, which are surfaces except for the light extraction surface of the light-emitting element 10, are covered by a first light reflecting member (see a reference number 16 in FIG. 21E) made of metal films of Al or dielectric multilayer films, and further, a surface 12b of the semiconductor layered body 12, which is a surface farther from the light transmissive substrate 11, is covered by a second reflecting member (see a reference number 7a in FIG. 1b), for example, made of the DBR film in which $SiO_2$ and $Nb_2O_5$ are alternately layered.

With this constitution, the light-emitting element 10 can extract light in the direction indicated by an arrow L. Also, with the third lateral surface T1 and T2 of the light transmissive substrate 11, light extraction efficiency of light emitted from the lateral surface of the light-emitting element 10 is improved and the distribution of emitted light in the perpendicular direction of the light-emitting element 10 can be narrowed. As a result, for example, the light coupling efficiency with respect to the light guiding plate in the backlight unit for the liquid crystal display device or with respect to an optical fiber can be improved.

Second Embodiment

A light-emitting element 20 according to the present embodiment includes, as illustrated in FIG. 2A, for example, a light transmissive substrate 21 made of sapphire and a semiconductor layered body 22 that is formed on the light transmissive substrate 21 and includes an active layer. All cross-sectional planes parallel to a first main surface 21a and a second main surface 21b of the light transmissive substrate 21 has a rectangle shape, but approximately all the cross-sectional planes can have the same shape.

The light transmissive substrate 21 has the first lateral surface P, which is one lateral surface adjacent to the first main surface 21a and the second main surface 21b. Also, the light transmissive substrate 21 has the second lateral surface S, which is a surface opposite to the first lateral surface P. A cross-sectional plane perpendicular to the first main surface and intersecting with the third lateral surface and the fourth lateral surface, that is, a cross-sectional plane parallel to the first lateral surface P and the second lateral surface S has a first concave figure including a first recess 21c. In addition, in the present embodiment, the light transmissive substrate 21 has a first protrusion 21d opposite to the first recess 21c. In this case, the first protrusion 21d has an angle of 90 degrees. The first concave figure of the light-emitting element 20 has a shape that allows a tessellation, and furthermore, in addition to that, the first lateral surface P and the second lateral surface S both has a shape that allows a tessellation. With the shape that allows a tessellation, the first protrusion 21 has a shape that is to be fitted into the shape of the first recess 21c.

Also, the light transmissive substrate 21 further includes a third lateral surface including two surfaces T1 and T2 that exist between the first main surface 21a and the second main surface 21b and positioned between the first lateral surface P and the second lateral surface S. The third lateral surface T1 and T2 forms the first recess 21c, and bent in the direction with respect to a direction from the first main surface 21a to the second main surface 21b, that is, with respect to the thickness direction so as to form respective surfaces. Also, the light transmissive substrate 21 has two surfaces of the fourth lateral surface F1 and F2 parallel to the two surfaces of the third lateral surface T1 and T2, respectively. The fourth lateral surface F1 and F2 is surfaces forming the first protrusion 21d, and bent in a direction with respect to the direction from the first main surface 21a to the second main surface 21b, that is, with respect to the thickness direction so as to form respective surfaces. The third lateral surface T1 and T2 may be arranged so as to be approximately symmetrical with respect to a cross-sectional plane parallel to the first main surface 21a that extends through the first recess 21c and the first protrusion 21d on the first lateral surface P. The light-emitting element 20 has a configuration substantially similar to that of the light-emitting element 10 of the first embodiment, except for the structures described above.

Figure 2B:
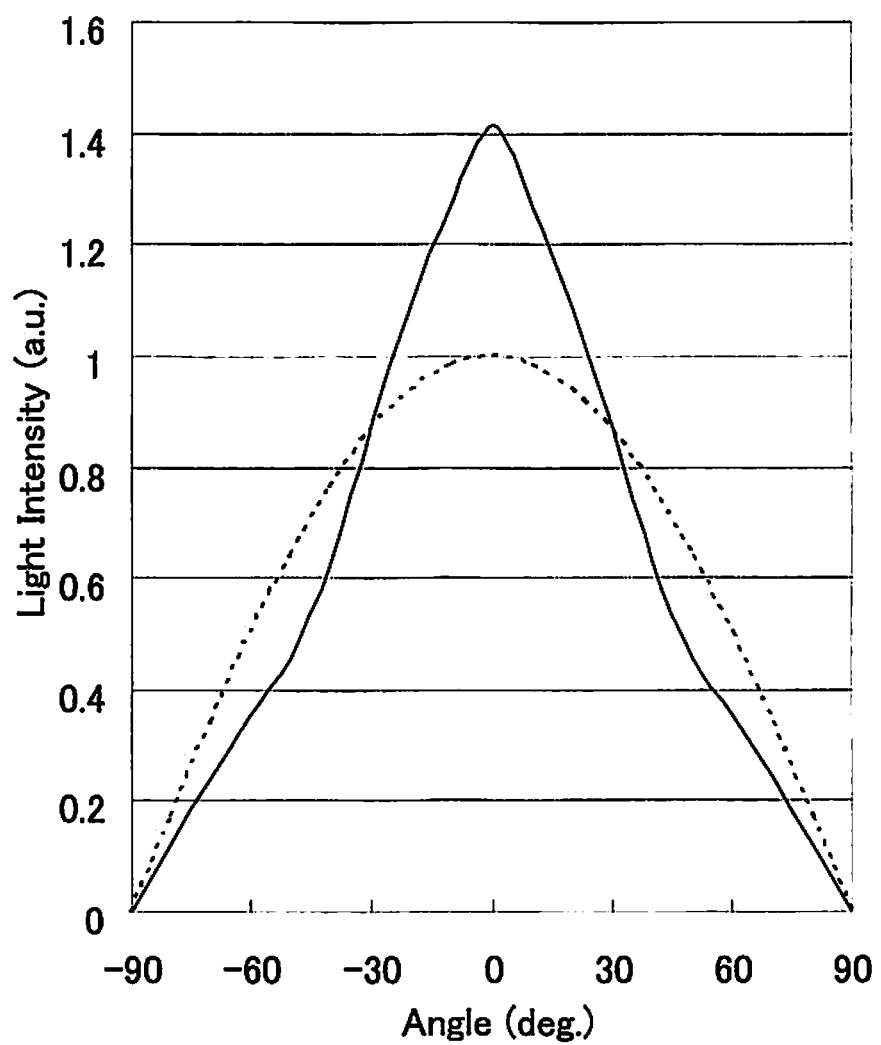
FIG. 2B is a schematic graph illustrating the light distribution of the light-emitting element in the vertical direction in FIG. 2A.

The light-emitting element 20 has the similar effect to that of the light-emitting element 10. A solid line in FIG. 2B indicates light distribution in the case where the deepest portion of the recess is arranged in the center of the light transmissive substrate 21 in the thickness direction. In particular, light intensity of light extracted in the direction indicated by the arrow L in FIG. 2A can be greatly increased in the vicinity of the center of the light emitting element in the direction perpendicular to the first main surface as indicated by the solid line in FIG. 2B compared with the light distribution (indicated by a dotted line in FIG. 2B) of edge-emission type light-emitting element having rectangular-parallelepiped or cube shape. Also, a half width of the light intensity can be narrowed, so that light distribution narrower than the light distribution of conventional light-emitting element having rectangular parallelepiped or cube shape can be achieved. It is noted that the light intensity with respect to each angle is obtained from results of simulation assuming that the light emission surface is a perfect diffusing surface.

The light-emitting element 20 described above can be formed by a manufacturing method below, for example.

Growing Semiconductor Layered Body

Figure 21A:
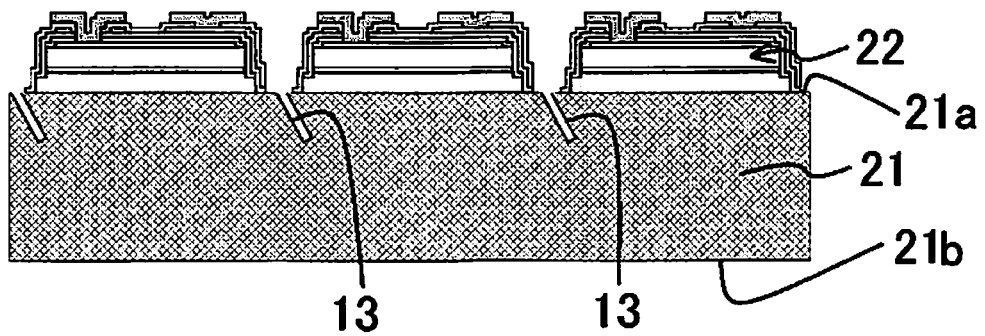
FIG. 21A to FIG. 21E are schematic cross-sectional views of essential parts of the light emitting elements to describe a manufacturing method of the light-emitting element according to an embodiment of the present invention.

The semiconductor layered body 22 including the first semiconductor layer, the active layer, and the second semiconductor layer is epitaxially grown on a sapphire substrate (thickness is 300 μm) that is to be the light transmissive substrate 21 as illustrated in FIG. 21A, for example, by use of the MOCVD method. In the crystal growth by the MOCVD method, hydrogen ($H_2$) or nitrogen ($N_2$) is used for carrier gas, and trimethylgallium (TMG) or triethylgallium (TEG) is used for group-III materials as Ga source, and trimethylaluminum (TMA) is used for Al source materials, and trimethylindium (TMI) is used for In source materials, and ammonia ($NH_3$) is used for group-V materials as N source, and monosilane ($SiH_4$) is used for Si materials that is an n-type dopant, and bis-cyclopentadienyl magnesium ($Cp_2Mg$) is used for Mg source materials that is a p-type dopant. Changing the amount of source gas that is supplied allows for adjusting the composition of each semiconductor layer. In the present specification, a substrate in the form of a wafer or a substrate singulated into individual chips are both referred to as the light transmissive substrate 21. After the formation of the semiconductor layered body 22, portions of the second semiconductor layer, the active layer, and the first semiconductor layer are removed with use of a mask to expose the first semiconductor layer and the light transmissive substrate 21, so that grooves dividing the semiconductor layered body 22 is formed.

Forming First Electrode and Second Electrode

A second electrode 8a, which is a transparent electrode, is formed on a predetermined portion of the second semiconductor layer by use of typical photolithography method, sputtering method, and lift-off method. Next, protective films 7a and 7b made of $SiO_2$ are formed on the entire surface of the semiconductor layered body 22 and the second electrode 8a using a plasma CVD method. Subsequently, a first electrode 9a, which is to be connected to the first semiconductor layer, and the protective film 7c are sequentially formed, and contact holes are formed in a portion of the protective film 7c on the first electrode 9a and in a portion of the protective films 7a, 7b, and 7c on the second electrode 8a on the second semiconductor layer by use of photolithography and reactive ion etching, and the first pad electrode 9b and the second pad electrode 8b are each formed in a predetermined shape so as to cover the contact holes.

Singulating into Chips

Figure 21B:
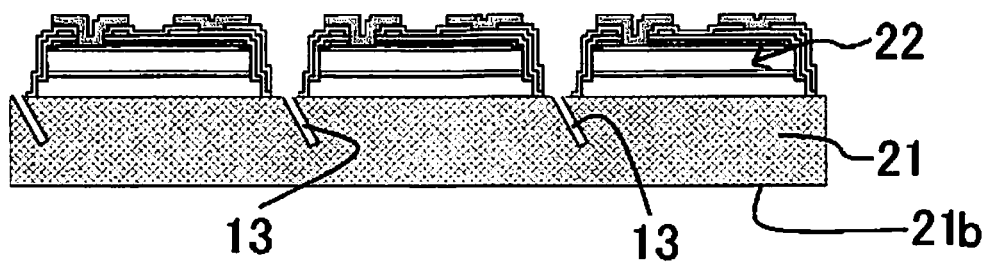
Figure 21C:
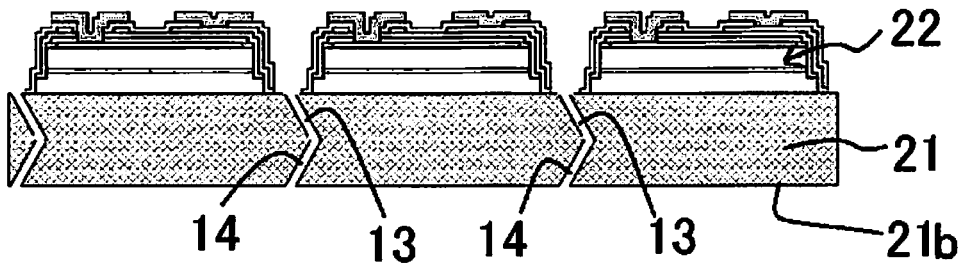

Next, a dicing tape is applied on the second main surface 21b of the light transmissive substrate 21, and the light transmissive substrate 21 is held in a dicing frame. Then, as illustrated in FIG. 21A, separation grooves 13 are obliquely formed in the first main surface 21a of the light transmissive substrate 21. The separation grooves are formed using, for example, dicing, dry etching, or laser machining (e.g., laser ablation machining, the LIBWE method, laser water jet method, or the like). For example, in one of the grooves dividing the semiconductor layered body 22 that are perpendicularly intersecting, the separation grooves, which are inclined at 45 degrees with respect to the main surface of the sapphire substrate, are formed up to a depth of 80 μm from the main surface of the sapphire substrate: Subsequently, as illustrated in FIG. 21B, the second main surface 21b of the light transmissive substrate 21 is removed by grinding so that the light transmissive substrate 21 have a predetermined thickness. For example, the light transmissive substrate 21 is grinded to have a thickness of approximately 160 μm. Thereafter, as illustrated in FIG. 21C, separation grooves 14 are obliquely formed in the second main surface 21b of the light transmissive substrate 21. Forming of the separation grooves 14 is performed such that, for example, a groove inclined at 45 degrees with respect to the main surface of the light transmissive substrate 21 is formed up to a depth of 80 μm in a predetermined portion in a predetermined direction.

Figure 21D:
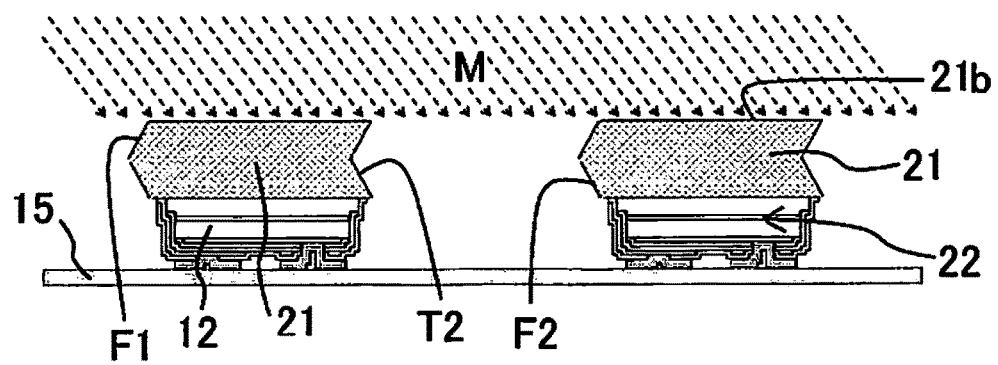
Figure 21E:
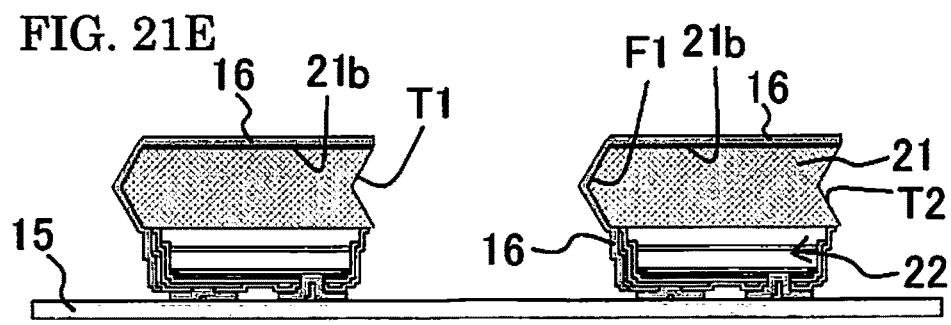

The light transmissive substrate is divided in a direction perpendicular to the second main surface to form the first lateral surface and the second lateral surface of the light transmissive substrate 21, so that the wafer is singulated into chips (i.e., light-emitting elements prior to the formation of light reflecting members). For example, the singulation can be performed by use of dicing, breaking, cleaving, laser beam machining, or the like. Accordingly, the light transmissive substrate 21 in the form of the wafer is formed into chips. Next, for example, the dicing tape is expanded, and the intervals between the chips are extended. Subsequently, as illustrated in FIG. 21D, The light-emitting elements 20 in the form of chips are arranged at appropriate intervals on an adhesive sheet 15, and the light reflecting member is sputtered to the second main surface 21b of the light transmissive substrate 21 in a diagonal direction. An arrow M in FIG. 21 indicates the direction of the sputtering the light reflecting member. With this, as illustrated in FIG. 21E, the first light reflecting member 16 can be formed on surfaces except for the third lateral surface T1 and T2, which is the light extraction surfaces of the light-emitting elements 20. Sputtering is used in the description above, but the first light reflecting member 16 made of light-reflective resin is may be formed by molding or applying.

Third Embodiment

Figure 3:
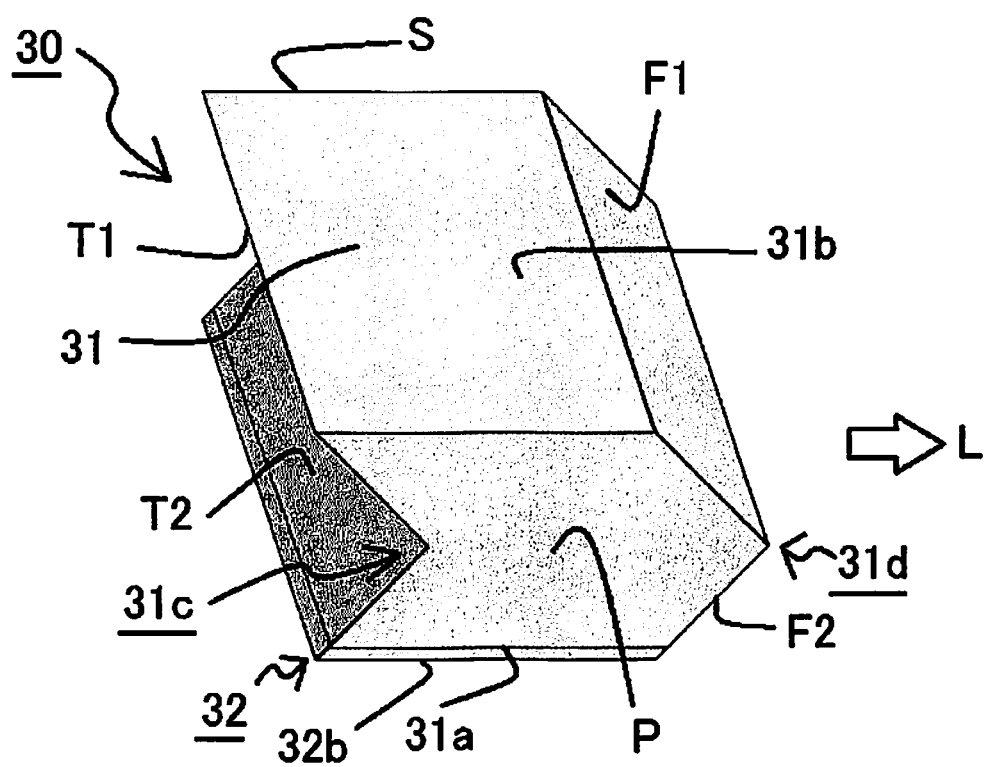
FIG. 3 is a schematic perspective view of the light-emitting element according to a third embodiment of the present invention.

In a light-emitting element 30 according to the present embodiment, as illustrated in FIG. 3, a configuration of the light transmissive substrate 31 and the semiconductor layered body 32 is substantially the same with the light transmissive substrate 21 and the semiconductor layered body 22 of the light-emitting element 20 according to the second embodiment, the light reflecting members are not formed on the fourth lateral surface F1 and F2 but formed on the third lateral surface T1 and T2, and light is extracted in the direction illustrated by the arrow L, not from a first recess 31c but from the side of a first protrusion 31d. The light-emitting element 30 essentially includes the first protrusion 31d, and a cross-sectional plane of the light transmissive substrate 31, which is perpendicular to a first main surface 31a and intersecting with the third lateral surface T1 and T2 and the fourth lateral surface F1 and F2, has a first figure having the first protrusion 31d.

With this configuration, the distribution of light emitted from the light-emitting element in the perpendicular direction of the light-emitting element can be broadened due to arrangement of the fourth lateral surface F1 and F2 of the light transmissive substrate.

Fourth Embodiment

A light-emitting element 40 according to the present embodiment includes, as illustrated in FIG. 4A, for example, a light transmissive substrate 41 made of sapphire, and the semiconductor layered body 42 that is formed on a first main surface 41a and includes the active layer. A cross-sectional plane parallel to the first main surface 41a and a second main surface 41b of the light transmissive substrate 41 has a second concave figure having a second recess 41e, and further, may have a second protrusion 41f opposite to the second recess 41e. For example, in this case, the second recess 41e has an inner angle of 270 degrees, and the angle of the second protrusion 41f has an inner angle of 90 degrees. Cross-sectional planes parallel to the first main surface 41a and the second main surface 41b has a shape of a parallel hexagon, and all the cross-sectional plane can have the same shape at any position in the light emitting element 40.

The light transmissive substrate 41 is bent with respect to the direction from the first main surface 41a to the second main surface 41b, that is, with respect to the thickness direction of the light transmissive substrate 41, and with respect to the direction from the first lateral surface P to the second lateral surface S, and at the same time, the light transmissive substrate 41 has third lateral surface including four surfaces T1, T2, T3, and T4 defining a first recess 41c. Also, the third lateral surface T1, T2, T3, and T4 serve as surfaces defining a second protrusion 41f. That is, a cross-sectional plane perpendicular to the first main surface and intersecting with the third lateral surface and the fourth lateral surface, i.e., a cross-sectional plane parallel to the first lateral surface P and the second lateral surface S has the first recess 41c. Also, the light transmissive substrate 41 is bent in the direction from the first main surface 41a to the second main surface 41b, that is, in the thickness direction, and with respect to the direction from the first lateral surface P to the second lateral surface S, and at the same time, the light transmissive substrate 41 has fourth lateral surface including four surfaces F1, F2, F3, and F4 defining the first protrusion 41d and are parallel to the third lateral surface T1, T2, T3, and T4, respectively. The fourth lateral surface F1, F2, F3, and F4 also serves as surfaces defining a second recess 41e.

In FIG. 4A, the third lateral surface T1 and T3 and the fourth lateral surface F1 and F3 are arranged so as to be symmetrical with respect to a plane that extends through the second recess 41e and the second protrusion 41f and is perpendicular to the second main surface 41b. With respect to a plane extending through the first recess 41c and the first protrusion 41d and parallel to the second main surface 41b, the third lateral surface T1 and T2, and T3 and T4, and the fourth lateral surface F1 and F2, and F3 and F4 are arranged so as to be approximately symmetrical. In the light-emitting element 40, the first recess 41c and the second recess 41e are each oriented to different directions. That is, in the present embodiment, the first recess 41c is arranged in the third lateral surface T1, T2, T3, and T4, which serves as light extraction surfaces, and the second recess 41e is arranged in the fourth lateral surface F1, F2, F3, and F4, which are opposite to the light extraction surfaces. In the description above, the third lateral surface T1 and T3 and the fourth lateral surface F1 and F3 are symmetrically arranged, but in the case where the light-emitting element is used for being arranged in the vicinity of corners of a light guiding plate, for example, the third lateral surface T1 and T3 and the fourth lateral surface F1 and F3 may be asymmetrically arranged.

The first main surface 41a, the second main surface 41b, the first lateral surface P, and the second lateral surface S of the light-emitting element 40 each have a shape allows a tessellation. The configuration of the light-emitting element 40 is substantially similar to that of the light-emitting element 20 of the second embodiment except for the structure illustrated above.

Figure 4B:
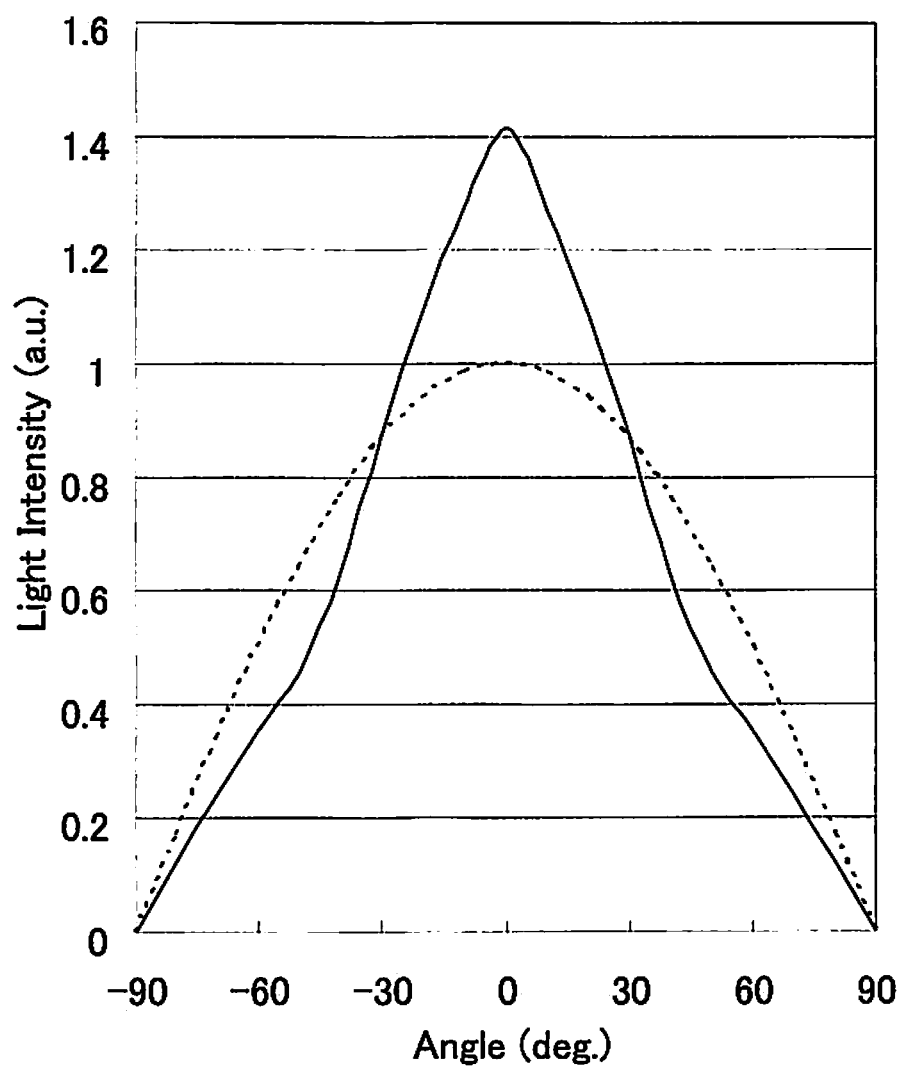
FIG. 4B is a schematic graph illustrating the light distribution of the light-emitting element in the vertical direction in FIG. 4A.
Figure 4C:
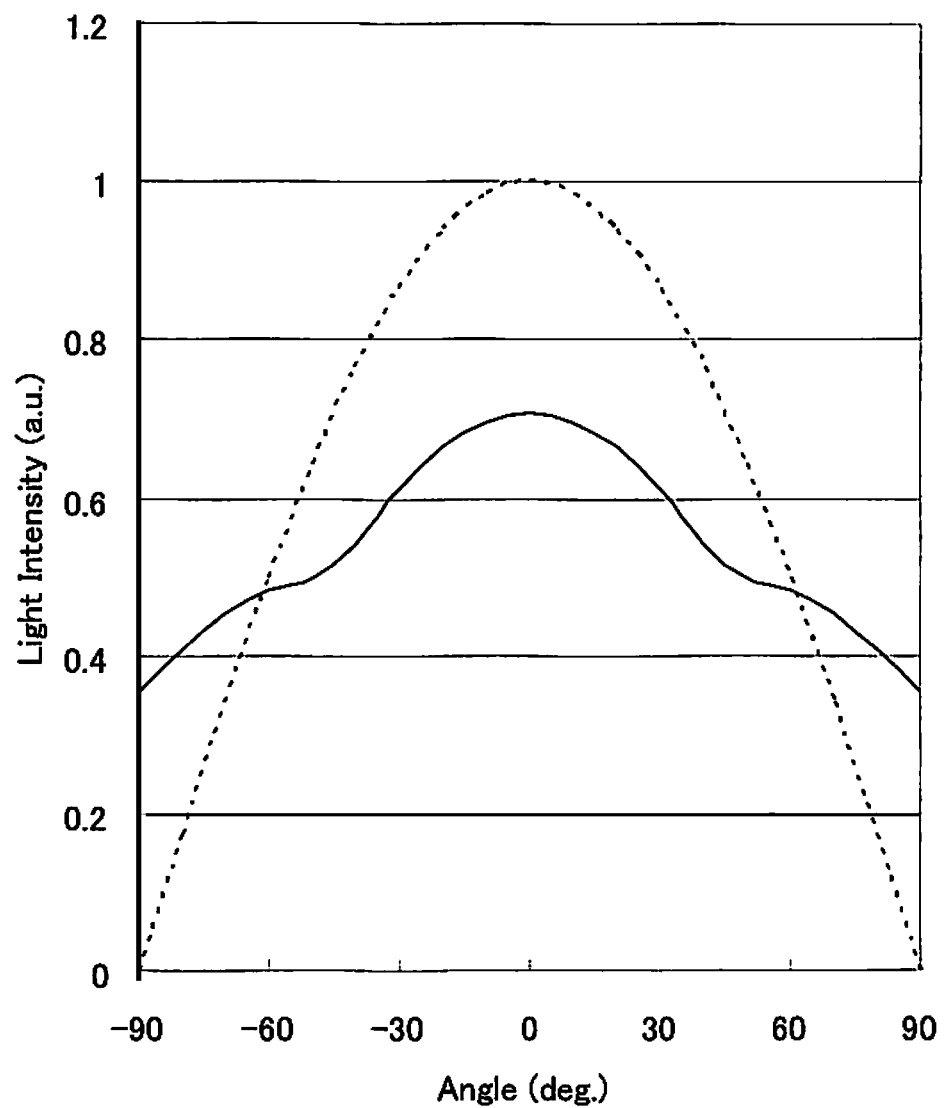
FIG. 4C is a schematic graph illustrating the light distribution of the light-emitting element in the horizontal direction in FIG. 4A.

The light-emitting element 40 exhibits a similar effect as that of the light-emitting elements 10 and 20. Solid lines in FIGS. 4B and 4C indicates the light distribution in the case where the deepest portion of the recess is arranged in the center in the thickness direction of the light transmissive substrate 21. In particular, light intensity of light extracted in the direction indicated by the arrow L in FIG. 4A can be greatly increased in the vicinity of the center of the direction perpendicular to the first main surface as indicated by the solid line in FIG. 4B, compared with the light distribution (indicated by a broken line in FIG. 4B) of conventional edge-emission type light-emitting element having rectangular-parallelepiped or cube shape. As well as that, as illustrated by the solid line in FIG. 4C, although the light intensity of light extracted in the direction illustrated by the arrow L is reduced in the vicinity of the center of the direction parallel to the first main surface of the light-emitting element, the light distribution can be broad compared with the light distribution (a broken line in FIG. 4C) of conventional edge-emission type light-emitting element having parallelepiped or cube shape. Thus, the light distribution of emitted light in the direction parallel to the upper surface (i.e., the first main surface) of the light-emitting element can be broadened, and uniformity of illumination can be ensured. It is noted that the light intensity with respect to each angle illustrated in FIG. 4B and FIG. 4C is obtained from results of simulation assuming that the light emission surface is a perfect diffusing surface.

Fifth Embodiment

Figure 5:
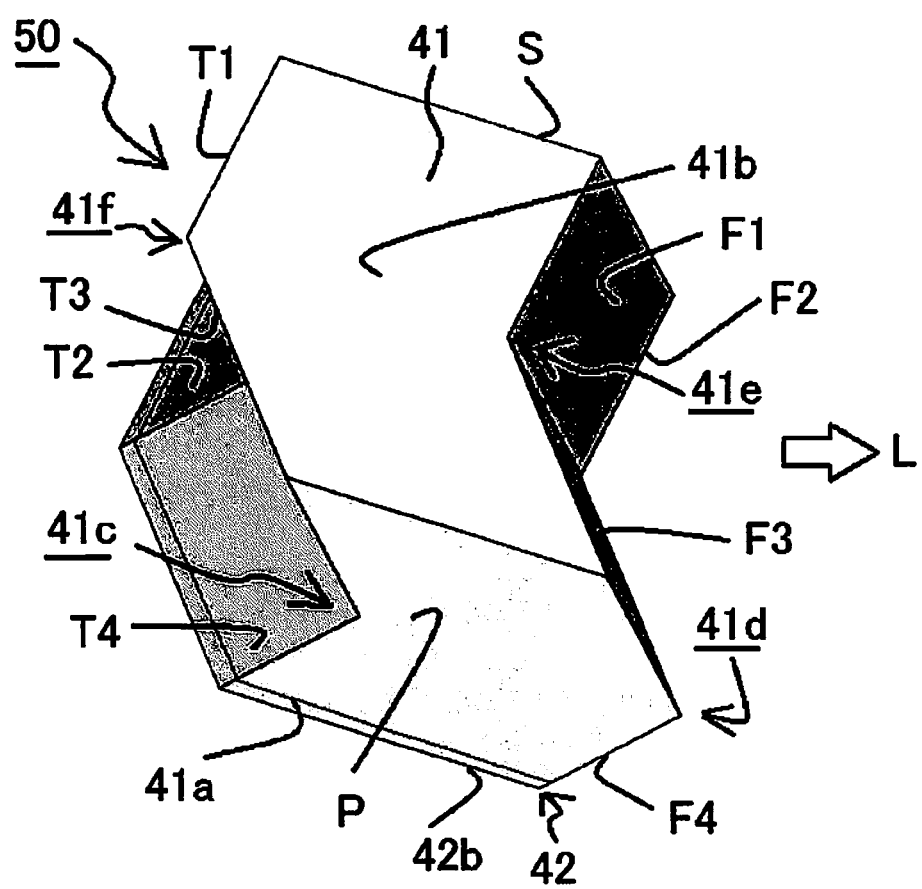
FIG. 5 is a schematic perspective view of the light-emitting element according to a fifth embodiment of the present invention.

In a light-emitting element 50 according to the present embodiment, as illustrated in FIG. 5, a configuration of light transmissive substrate 41 and semiconductor layered body 42 is substantially the same with those of the light-emitting element 40 according to the fourth embodiment, and light reflecting members are not formed on fourth lateral surface F1, F2, F3, and F4 but formed on third lateral surface T1, T2, T3, and T4, and light is extracted in a direction indicated by the arrow L from a side of first protrusion 41d and the second recess 41e. The light-emitting element 50 essentially includes the first protrusion 41d, and a cross-sectional plane of the light transmissive substrate 41, which is perpendicular to the first main surface 41a and intersecting with the third lateral surface T1 and T2 and the fourth lateral surface F1 and F2, has a first shape having the first protrusion 41d. In the light-emitting element 50, the outermost portion of the first protrusion 41d is provided on the outer side of a periphery of the semiconductor layered body 42.

The fourth lateral surface includes one or more surfaces F1, F2, F3, and F4 defining the first protrusion 41d. Furthermore, in the light-emitting element 50, a cross-sectional plane parallel to the first main surface 41a of the light transmissive substrate 41 has a second figure that includes one or more second protrusion 41f. In the light-emitting element 50, the first protrusion 41d and the second protrusion 41f are each oriented to different directions. That is, in the present embodiment, the first protrusion 41d is arranged in the fourth lateral surface F1, F2, F3 and F4, which are the light extraction surfaces, and the second protrusion 41f is arranged in the third lateral surface T1, T2, T3 and T4, which are opposite to the light extraction surfaces.

With this structure, the distribution of emitted light in the perpendicular direction of the light-emitting element can be broadened due to arrangement of the fourth lateral surface F1 and F2 of the light transmissive substrate.

Sixth Embodiment

A light-emitting element 60 according to the present embodiment includes, as illustrated in FIG. 6, for example, a light transmissive substrate 61 made of sapphire, and a semiconductor layered body 62 that is formed on a first main surface 61a of the light transmissive substrate 61 and includes the active layer. A cross-sectional plane parallel to the first main surface 61a and a second main surface 61b of the light transmissive substrate 61 has the second concave figure having a second recess 61e, and further has a second protrusion 61f opposite to the second recess 61e. For example, in this case, the inner angle of the second recess 61e is 270 degrees, and the inner angle of the second protrusion 61f is 90 degrees. The cross-sectional planes parallel to the first main surface 61a and the second main surface 61b each has a shape of parallel hexagon at any position, and all the cross-sectional planes have the same shape. The first main surface 61a and the second main surface 61b of the light-emitting element 60 each has a shape that allows a tessellation.

Surfaces T1 and T3, and T2 and T4 of the third lateral surface, and surfaces F1 and F3, and F2 and F4 of the fourth lateral surface, are symmetrically arranged with respect to a plane that extends through the second recess 61e and the second protrusion 61f and is perpendicular to the second main surface 61b. That is, a cross-sectional plane perpendicular to the first main surface and intersecting with the third lateral surface and the fourth lateral surface, that is, a cross-sectional plane parallel to the first lateral surface P and the second lateral surface S has the first recess 61c. In the light-emitting element 60, the first recess 61c and the second recess 61e are oriented in the same direction, that is, in the light extracting direction (i.e., in the direction indicated by the arrow L). That is, both of the first recess 61c and the second recess 61e are arranged in the third lateral surface T1 and T3, and T2 and T4, respectively, which are the light extraction surfaces. The structure of the light-emitting element 60 is substantially similar to that of the light-emitting element 40 according to the fourth embodiment except for the configuration described above. With the light-emitting element 60, the light intensity of light in the vicinity of the center of the direction perpendicular to the first main surface of the light-emitting element can be greatly improved compared with that in the light distribution of a conventional edge-emission type light-emitting element having rectangular-parallelepiped or cube shape. As well as that, the light intensity of light in the vicinity of the center of the direction parallel to the first main surface of the light emitting element can also be improved compared with that in the light distribution of the conventional edge-emission type light-emitting element having rectangular-parallelepiped or cube shape. With this configuration, a light-emitting element suitable for, for example, optical fibers can be obtained.

Seventh Embodiment

Figure 7:
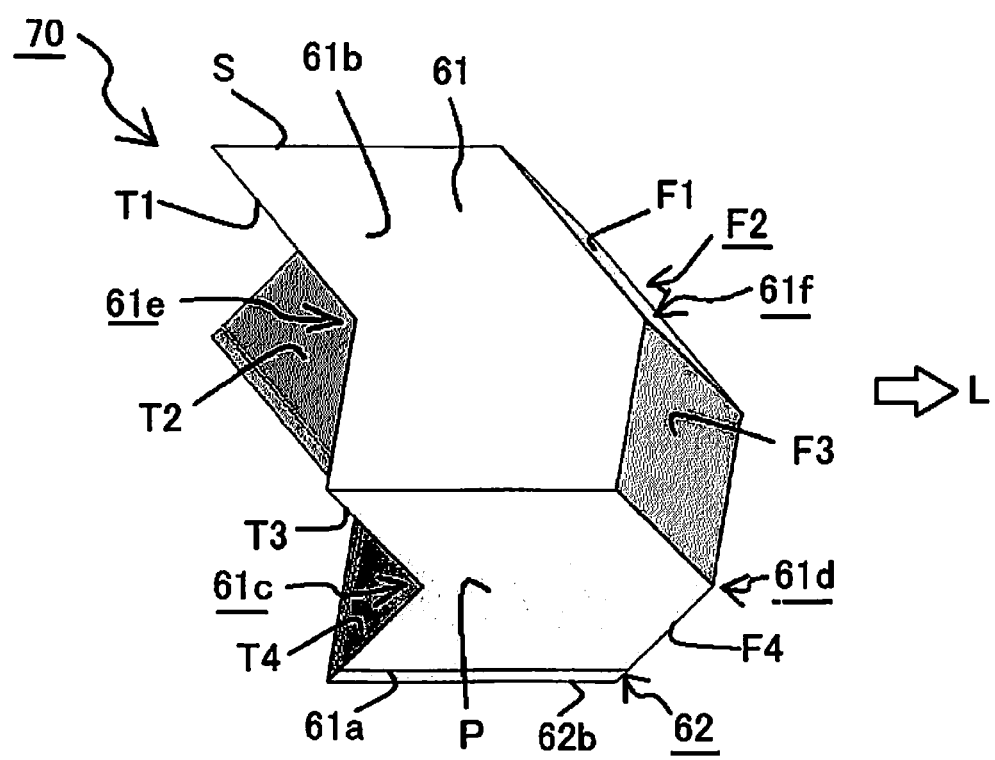
FIG. 7 is a schematic perspective view of the light-emitting element according to a seventh embodiment of the present invention.

In a light-emitting element 70 according to the present embodiment, as illustrated in FIG. 7, a configuration of a light transmissive substrate 61 and a semiconductor layered body 62 is substantially the same with those of the light-emitting element 60 of the sixth embodiment, and the light reflecting member is not formed on the fourth lateral surface F1, F2, F3, and F4 but formed on the third lateral surface T1, T2, T3, and T4, and light is extracted in the direction indicated by the arrow L from the side of first protrusion 61d and the second protrusion 61f. The light-emitting element 70 essentially includes the first protrusion 61d, and a cross-sectional plane of the light transmissive substrate 61, which is perpendicular to the first main surface 61a and intersecting with the third lateral surface T1 and T2 and the fourth lateral surface F1 and F2, has the first shape having the first protrusion 61d. Furthermore, in the light-emitting element 70, a cross-sectional plane parallel to the first main surface 61a of the light transmissive substrate 61 has a second shape that has one or more second protrusions 61f. In the light-emitting element 70, the outermost portion of the first protrusion 61d is provided on the outer side of the periphery of the semiconductor layered body 62, and the fourth lateral surface F1, F2, F3, and F4 includes one or more surfaces defining the first protrusion 61d. That is, in the light-emitting element 70, the first protrusion 61d and the second protrusion 61f are oriented in the same direction. That is, the first protrusion 61d and the second protrusion 61f both are arranged in the fourth lateral surface F1, F2, F3, and F4 that is the light extraction surfaces.

With this structure, the distribution of emitted light in the perpendicular direction and the parallel direction of the light-emitting element can be broadened due to arrangement of the fourth lateral surface F1 and F2 of the light transmissive substrate.

Eighth Embodiment

A light-emitting element 80 according to the present embodiment includes, as illustrated in FIG. 8, for example, a light transmissive substrate 81 made of sapphire, and a semiconductor layered body 82 that is formed on a first main surface 81a and includes an active layer. A cross-sectional plane parallel to the first main surface 81a and a second main surface 81b of the light transmissive substrate 81 has the second concave figure having second recesses 81e and 81g, and further has second protrusions 81f and 81h that are opposite to the second recesses 81e and 81g, respectively. For example, in this case, the inner angle of a second recess 81e is 225 degrees, and the inner angle of the second recess 81g is 225 degrees, and the inner angle of a second protrusion 81f is 135 degrees, and the inner angle of the second protrusion 81h is 135 degrees. The cross-sectional planes parallel to the first main surface 81a and the second main surface 81b each has a parallel octagon, and all the cross-sectional planes have the same shape at any position.

The light transmissive substrate 81 is bent in a direction with respect to the direction from the first main surface 81a to the second main surface 81b, that is, with respect to the thickness direction, and with respect to the direction from a first lateral surface P to a second lateral surface S, and has a third lateral surface including six lateral surfaces T1, T2, T3, T4, T5, and T6 defining a first recess 81c. The third lateral surface T1, T2, T3, and T4 also serve as surfaces defining the second protrusion 81f, and the third lateral surface T3, T4, T5, and T6 also serve as surfaces defining the second protrusion 81h. Also, the light transmissive substrate 81 is bent in a direction with respect to the direction from the first main surface 81a to the second main surface 81b, that is, with respect to the thickness direction, and with respect to the direction from the first lateral surface P to the second lateral surface S, and has a fourth lateral surface including six lateral surfaces F1, F2, F3, F4, F5, and F6 defining a first protrusion 81d and parallel to the six lateral surfaces T1, T2, T3, T4, T5, and T6 of the third lateral surface, respectively. The fourth lateral surface F1, F2, F3, and F4 also serve as surfaces defining the second recess 81e, and the fourth lateral surface F3, F4, F5, and F6 also serve as surfaces defining the second recess 81g. A cross-sectional plane perpendicular to the first main surface and intersecting with the third lateral surface and the fourth lateral surface, that is, a cross-sectional plane parallel to the first lateral surface P and the second lateral surface S has the first recess 81c.

In the second main surface 81b, the third lateral surface T1 and T5, and T2 and T6, and the fourth lateral surface F1 and F5, and F2 and F6, respectively, are arranged so as to be symmetrical with respect to a cross-sectional plane perpendicular to the second main surface that extends through a middle point between the second recess 81e and the second recess 81g and a middle point between the second protrusion 81f and the second protrusion 81h. The third lateral surface T1 and T2, T3 and T4, and T5 and T6 and the fourth lateral surface F1 and F2, F3 and F4, and F5 and F6, respectively, are arranged so as to be approximately symmetrical with respect to a plane parallel to the second main surface 81b that extends through the first recess 81c and the first protrusion 81d. In the light-emitting element 80, the first recess 81c, the second recess 81e, and the second recess 81g are oriented to directions different from one another. That is, the first recess 81c is arranged in the third lateral surface T1, T2, T3, T4, T5, and T6, which are light extraction surfaces, and the second recess 81e, and the second recess 81g are arranged in the fourth lateral surface F1, F2, F3, F4, F5, and F6 which is opposite to the light extraction surfaces.

The first main surface 81a, the second main surface 81b, the first lateral surface P, and the second lateral surface S of the light-emitting element 80, as illustrated in FIG. 8, each have a shape that allows a tessellation. The configuration of the light-emitting element 80 is substantially similar to that of the light-emitting element 40 according to the fourth embodiment except for the structure described above. With the light-emitting element 80, similarly to the light-emitting element 40, the light intensity of light in the vicinity of the center of the direction perpendicular to the first main surface of the light-emitting element can be greatly high, and light distribution in the direction parallel to the first main surface is broadened compared with that in the light distribution of a conventional edge-emission type light-emitting element having rectangula-parallelepiped or cube shape.

Ninth Embodiment

Figure 9:
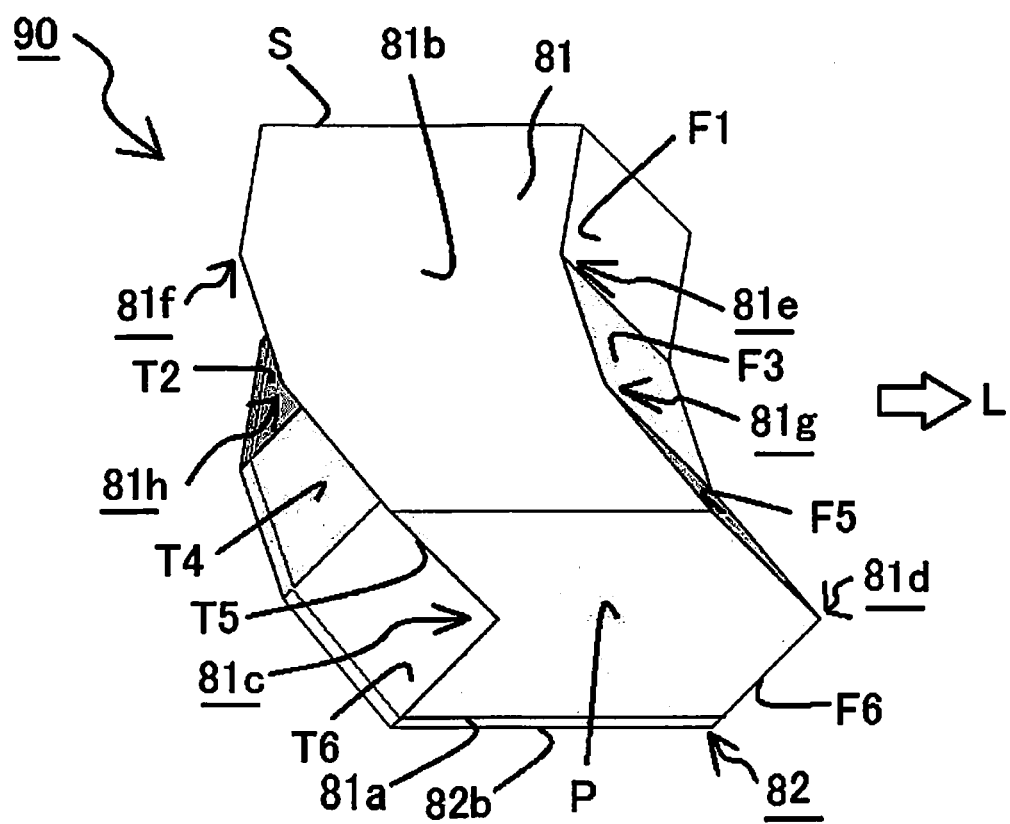
FIG. 9 is a schematic perspective view of the light-emitting element according to a ninth embodiment of the present invention.

In a light-emitting element 90 according to the present embodiment, as illustrated in FIG. 9, a configuration of a light transmissive substrate 81 and a semiconductor layered body 82 is substantially the same with those of the light-emitting element 80 according to the eighth embodiment, and a light reflecting member is not formed on the fourth lateral surface F1, F2, F3, F4, F5, and F6 but formed on the third lateral surface T1, T2, T3, T4, T5, and T6 and light is extracted in the direction indicated by the arrow L from the side of first protrusion 81d, the second recess 81e, and the second recess 81g. The light-emitting element 90 essentially includes the first protrusion 81d and the second recess 81e, and a cross-sectional plane of the light transmissive substrate 81, which is perpendicular to the first main surface 81a and intersecting with the third lateral surface T1 and T2 and the fourth lateral surface F1 and F2, has the first shape having the first protrusion 81d. Furthermore, in the light-emitting element 90, a cross-sectional plane parallel to the first main surface 81a of the light transmissive substrate 81 has a second figure that has one or more second protrusions 81f and 81h. With this configuration, with the light-emitting element 90, similarly to the light-emitting element 50 according to the fifth embodiment, the light distribution in the direction perpendicular to the first main surface can be broadened, and the light intensity can be greatly high in the vicinity of the center of the direction parallel to the first main surface, compared with that in the light distribution of a conventional edge-emission type light-emitting element having rectangular-parallelepiped or cube shape.

Tenth Embodiment

A light-emitting element 100 according to the present embodiment includes, as illustrated in FIG. 10, for example, a light transmissive substrate 101 made of sapphire, and a semiconductor layered body 102, which is formed on a first main surface 101a and includes the active layer. A cross-sectional plane parallel to the first main surface 101a and a second main surface 101b of the light transmissive substrate 101 has a second concave figure that includes second recesses 101e and 101g, and further has a second protrusion 101f opposite to the second recess 101e and a second protrusion 101h opposite to the second recess 101g. For example, in this case, the second recess 101e has an angle of 225 degrees, and the second protrusion 101f has an angle of 135 degrees, and the second recess 101g has an angle of 225 degrees, and the second protrusion 101h has an angle of 135 degrees. With these angles, cross-sectional planes parallel to the first main surface 101a and the second main surface 101b can each have a shape of a parallel octagon, and all of these cross-sectional planes can have the same shape. The first main surface 101a and the second main surface 101b of the light-emitting element 100 each has a shape that allows a tessellation.

The third lateral surface T1 and T5, and T2 and T6, and the fourth lateral surface F1 and F5, and F2 and F6, respectively, are arranged so as to be symmetrical with respect to a cross-sectional plane, which is perpendicular to the second main surface 101b and extends through a middle point between the second recess 101e and the second recess 101g and a middle point between the second protrusion 101f and the second protrusion 101h on the second main surface 101b. That is, a cross-sectional plane perpendicular to the first main surface 101a and intersects with the third lateral surface and the fourth lateral surface, that is, a cross-sectional plane parallel to the first lateral surface P and the second lateral surface S in FIG. 10 has the first recess 101c. In the light-emitting element 100, the first recess 101c, the second recesses 101e and 101g are oriented in the same direction, that is, in the light extracting direction (in the direction indicated by the arrow L). The configuration of the light-emitting element 100 is substantially similar to that of the light-emitting element 60 according to the sixth embodiment except for the structure described above. With the light-emitting element 100, similarly to the light-emitting element 60, the light intensity in the vicinity of the center of both a direction perpendicular to the first main surface and a direction parallel to the first main surface can be greatly increased compared with that in the light distribution of a conventional edge-emission type light-emitting element having rectangular-parallelepiped or cube shape.

Eleventh Embodiment

Figure 11:
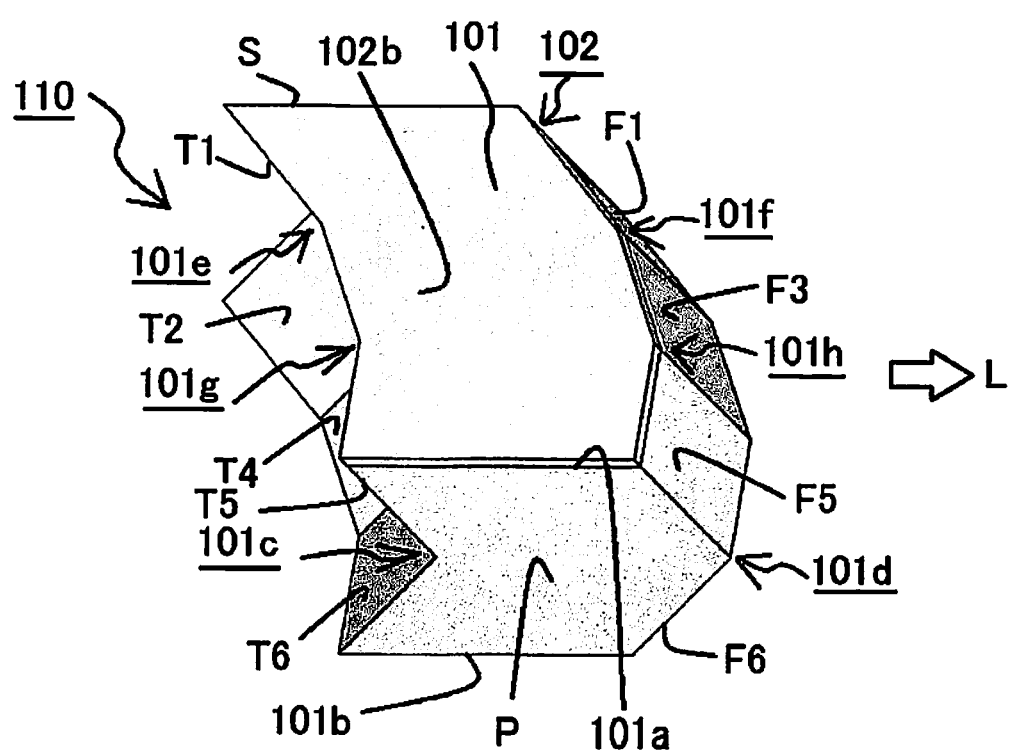
FIG. 11 is a schematic perspective view of the light-emitting element according to an eleventh embodiment of the present invention.

In a light-emitting element 110 according to the present embodiment, as illustrated in FIG. 11, a configuration of a light transmissive substrate 101 and a semiconductor layered body 102 is substantially the same with that of the light-emitting element 100 according to the tenth embodiment, and light reflecting members are not formed on the fourth lateral surface F1, F2, F3, F4, F5, and F6 but formed on the third lateral surface T1, T2, T3, T4, T5, and T6, and light is extracted in the direction indicated by the arrow L from the side of a first protrusion 101d and the second protrusions 101f and 101h. The light-emitting element 110 essentially has the first protrusion 101d, and a cross-sectional plane of the light transmissive substrate 101, which is perpendicular to the first main surface 101a and intersects with the third lateral surface T1 and T2 and the fourth lateral surface F1 and F2, has the first figure having the first protrusion 101d. Furthermore, in the light-emitting element 110, a cross-sectional plane parallel to the first main surface 101a of the light transmissive substrate 101 has a second figure that includes one or more second protrusions 101f and 101h. With this configuration, with the light-emitting element 110, similarly to the light-emitting element 70, the light distribution is broadened with respect to both a direction perpendicular to the first main surface 101a and a direction parallel to the first main surface 101a compared with that in the light distribution of a conventional edge-emission type light-emitting element having rectangular-parallelepiped or cube shape.

Twelfth Embodiment

Figure 12:
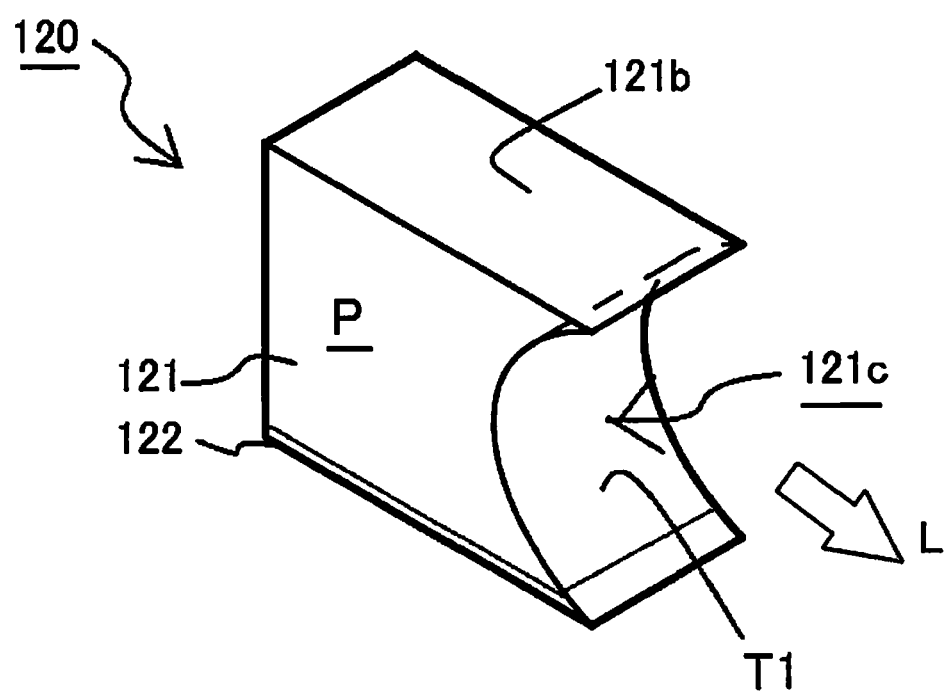
FIG. 12 is a schematic perspective view of the light-emitting element according to a twelfth embodiment of the present invention.

A light-emitting element 120 according to the present embodiment has, as illustrated in FIG. 12, third lateral surface including only one surface T1 that is a curved surface. A cross-sectional plane perpendicular to the first main surface and intersecting with the third lateral surface and the fourth lateral surface, that is, a cross-sectional plane parallel to the first lateral surface P and the second lateral surface S has a first recess 121c. The configuration of the first recess 121c is substantially similar to that of the first embodiment, except for that the recess is a rounded concave shape. With this configuration, an effect similar to that of the first embodiment can be obtained.

Thirteenth Embodiment

Figure 13:
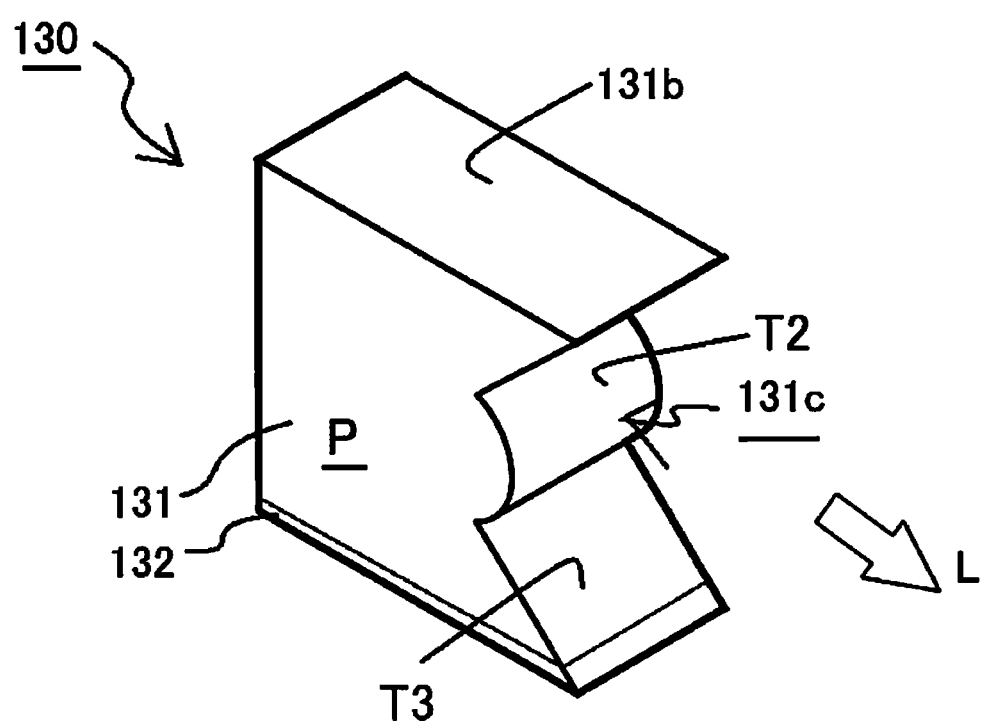
FIG. 13 is a schematic perspective view of the light-emitting element according to a thirteenth embodiment of the present invention.

A light-emitting element 130 according to the present embodiment has, as illustrated in FIG. 13, third lateral surface including three surfaces T1, T2, and T3 that include a curved surface. A cross-sectional plane perpendicular to the first main surface and intersecting with the third lateral surface and the fourth lateral surface, that is, a cross-sectional plane parallel to the first lateral surface P and the second lateral surface S has the first recess 131c. The configuration of the first recess 131c is substantially similar to that of the first embodiment, except for the having a small rounded protrusion in the central portion thereof. With this configuration, an effect similar to that in the first embodiment can be obtained.

Fourteenth Embodiment

A light-emitting element 140 according to the present embodiment has, as illustrated in FIG. 14, third lateral surface including two surfaces T1 and T2 that are curved surfaces. A cross-sectional plane perpendicular to a first main surface and intersecting with the third lateral surface and the fourth lateral surface, that is, a cross-sectional plane parallel to the first lateral surface P and the second lateral surface S has a first recess 141c. A cross-sectional plane parallel to a second main surface 140b has a second recess 141e. The configuration of the light-emitting element 140 according to the fourteenth embodiment is substantially similar to the light-emitting element 60 of the sixth embodiment, except that the first recess 141c has a concave shape that is rounded, and that the second recess 141e is defined by two sides intersecting with each other in a plan view. With this configuration, an effect similar to that in the sixth embodiment can be obtained.

Fifteenth Embodiment

A light-emitting element 150 according to the present embodiment has, as illustrated in FIG. 15, third lateral surface including six surfaces T1 to T6 that include curved surfaces. That is, a cross-sectional plane perpendicular to the first main surface and intersecting with the third lateral surface and the fourth lateral surface, that is, a cross-sectional plane parallel to the first lateral surface P and the second lateral surface S has a first recess 151c. A cross-sectional plane parallel to a second main surface 150b includes a second recess 151e. The configuration of the light-emitting element 150 according to the fifteenth embodiment is substantially similar to that of the sixth embodiment, except that the first recess 151c includes a small rounded protrusion in the central portion thereof, and the second recess 151e is defined by two sides intersecting with each other in a plan view. With this configuration, an effect similar to that in the sixth embodiment can be obtained.

Sixteenth Embodiment

Figure 16:
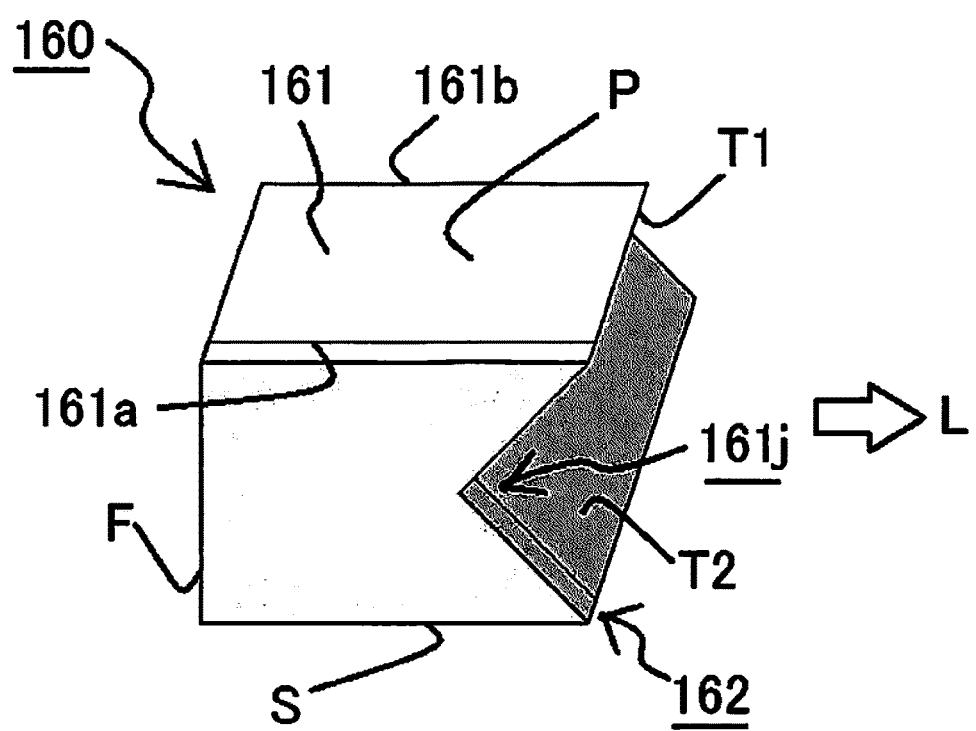
FIG. 16 is a schematic perspective view of the light-emitting element according to a sixteenth embodiment of the present invention.

A light-emitting element 160 according to the present embodiment includes, as illustrated in FIG. 16, a light transmissive substrate 161 and a semiconductor layered body 162, which is formed on a first main surface 161a and includes an active layer 162a. In the light transmissive substrate 161, the first main surface 161a and a second main surface 161b disposed on the opposite side of the first main surface 161a each has a third recess 161j. The third recess 161j has an inner angle of, for example, 270 degrees.

The light transmissive substrate 161 has a first lateral surface P, which is one lateral surface adjacent to the first main surface 161a and the second main surface 161b. Also, the light transmissive substrate 161 has a second lateral surface S that is a surface opposite to the first lateral surface P. The first lateral surface P and the second lateral surface S are arranged in parallel. The first lateral surface P and the second lateral surface S are perpendicular to the first main surface 161a and the second main surface 161b. Cross-sectional planes parallel to the first lateral surface S and the second lateral surface P each has a quadrangle shape at any position in the light-emitting element 160, but these cross-sectional planes are different in shape and size.

Also, the light transmissive substrate 161 further has third lateral surface including two surfaces T1 and T2 that exist between the first main surface 161a and the second main surface 161b and that are disposed between the first lateral surface P and the second lateral surface S. The third lateral surface T1 and T2 is bent with respect to a direction from the first lateral surface P to the second lateral surface S to form respective surfaces. The third lateral surface T1 and T2 is arranged so as to be approximately symmetrical with respect to a plane that extends through the third recess 161j in the first main surface 161a and the second main surface 161b and that is parallel to the first lateral surface P and the second lateral surface S. The light transmissive substrate 161 has one of fourth lateral surface F opposite to the third lateral surface T1 and T2. The fourth lateral surface F is perpendicular to the first main surface 161a, the second main surface 161b, the first lateral surface P, and the second lateral surface S.

In the light-emitting element 160, the fourth lateral surface F opposite to the third lateral surface T1 and T2, the first lateral surface P that is adjacent to the first main surface 161a, the second main surface 161b, and the third lateral surface T1, the second lateral surface S opposite to the first lateral surface P, the second main surface 161b, and a surface of the semiconductor layered body 162 that is farthest from the light transmissive substrate 161, are covered by light reflecting members. With this arrangement, the light-emitting element 160 has a structure with which light is extracted in the direction indicated by the arrow L. The configuration of the light-emitting element 160 is substantially similar to that of the light-emitting element 10 according to the first embodiment except for the configuration described above. The light-emitting element 160 has a similar effect as that of the light-emitting element 10.

Seventeenth Embodiment

In a light-emitting element 170 according to the present embodiment, as illustrated in FIG. 17, a plurality of light transmissive substrates 171, for example, made of n-type GaN, and a plurality of semiconductor layered bodies 172, each of which is formed on the light transmissive substrate 171 and includes the active layer, are alternately stacked. In this case, a main surface of the light transmissive substrate 171 that serve as an end surface of the light-emitting element 170 is referred to as a first main surface 170*a*, and a main surface of the semiconductor layered body 172 that serve as another end surface of the light-emitting element 170 is referred to as a second main surface 170*b*. A cross-sectional plane parallel to the first main surface 170*a* and the second main surface 170*b* has a third concave figure having a third recess 170*j*, and the third concave figure has a third protrusion 170*k* opposite to the third recess 170*j*. In the description below, the third recess 170*j* and the third protrusion 170*k* have angles of, for example, 270 degrees and 90 degrees, respectively. Cross-sectional planes parallel to the first main surface 170*a* and the second main surface 170*b* each has a shape of a parallel hexagon at any position in the light-emitting element 170.

The light-emitting element 170 has a first lateral surface Ps, which is one lateral surface adjacent to the first main surface 170*a* and the second main surface 170*b*. Also, the light-emitting element 170 has a second lateral surface Ss, which is a surface opposite to the first lateral surface Ps. The first lateral surface Ps, the second lateral surface Ss, and surfaces parallel to the first lateral surface Ps and the second lateral surface Ss each has a rectangle shape, and all the cross-sectional planes at any position in the light emitting element 170 have the same shape.

Also, the light-emitting element 170 has third lateral surface including two lateral surfaces Ts1 and Ts2 that exist between the first main surface 170*a* and the second main surface 170*b* and disposed between the first lateral surface Ps and the second lateral surface Ss. The third lateral surface Ts1 and Ts2 is surfaces constituting the third recess 170*j*, and are bent in the direction from the first lateral surface Ps to the second lateral surface Ss to form respective surfaces. Furthermore, the light-emitting element 170 can have a fourth lateral surface including two surfaces Fs1 and Fs2 parallel to the two surfaces Ts1 and Ts2 of third lateral surface, respectively. The fourth lateral surface Fs1 and Fs2 is surfaces constituting the third protrusion 170*k*, and bent with respect to a direction from the first lateral surface Ps to the second lateral surface Ss to form respective surfaces. The third lateral surface Ts1 and Ts2 and the fourth lateral surface Fs1 and Fs2, respectively, are arranged so as to be approximately symmetrical with respect to a plane perpendicular to the first main surface 170*a* and extends through the third recess 170*j* and the third protrusion 170*k*.

In the light-emitting element 170, the fourth lateral surface Fs1 and Fs2 opposite to the two surfaces Ts1 and Ts2 of the third lateral surface forming the third recess 1703, the first lateral surface Ps adjacent to the first main surface 170*a*, the second main surface 170*b*, and Ts1 of the third lateral surface, the second lateral surface Ss opposite to the first lateral surface Ps, and the first main surface 170*a* are covered by a first light reflecting member. Also, the second main surface 170*b* is covered by a second light reflecting member. Accordingly, the third lateral surface Ts1 and Ts2 on the side of the third recess 170*j* serves as the light extraction surface. The configuration of the light-emitting element 170 is substantially similar to that of the light-emitting element 20 according to the second embodiment except for the configuration described above. Accordingly, the light-emitting element 170 exhibits an effect similar to that of the light-emitting element 20. Furthermore, in the light-emitting element 170, a plurality of active layers are formed, and light can be extracted from all the active layers in a direction through the lateral surfaces, so that the light extraction efficiency can be achieved while greatly reducing light absorption.

Eighteenth Embodiment

In a light-emitting element 180 according to the present embodiment, as illustrated in FIG. 18, a plurality of light emitting units, each of which includes a light transmissive substrate 181, for example, made of n-type GaN, and a semiconductor layered body 182, which is formed on the light transmissive substrate 181 and includes the active layer, are stacked. More specifically, for example, the light-emitting element 180 has a configuration such that the plurality of transmissive substrates 181 and the plurality of semiconductor layered bodies 182, each of which is formed on the light transmissive substrate 181 and includes the active layer, are alternately layered. In the present embodiment, a main surface of the light transmissive substrate 181 that serve as an end surface of the light-emitting element 180 is referred to as a first main surface 180*a*, and a main surface of the semiconductor layered body 182 that serve as another end surface of the light-emitting element 180 is referred to as a second main surface 180*b*. A cross-sectional plane parallel to the first main surface 180*a* and the second main surface 180*b* has a third concave figure that has a third recess 180*j* and that includes a third protrusion 180*k* opposite to the third recess 180*j*. All cross-sectional planes parallel to the first main surface 180*a* and the second main surface 180*b* each has a shape of a parallel hexagon.

The light-emitting element 180 has a first lateral surface Ps, which is one lateral surface adjacent to the first main surface 180*a* and the second main surface 180*b*. Also, the light-emitting element 180 has a second lateral surface Ss, which is a surface opposite to the first lateral surface Ps. A cross-sectional plane perpendicular to the first main surface 180*a* and intersects with the third lateral surface and the fourth lateral surface, that is, a cross-sectional plane parallel to the first lateral surface Ps and the second lateral surface Ss in FIG. 18, has a fourth concave FIG. 180*r* having a fourth recess 180*q*, and the fourth concave figure has a fourth protrusion opposite to the fourth recess 180*q*. For example, in this case, the fourth recess 180*q* has an angle of 270 degrees, and the fourth protrusion 180*r* has an angle of 90 degrees. With these angles, cross-sectional planes parallel to the first lateral surface Ps and the second lateral surface Ss each have a shape of a parallel hexagon, and all of these cross-sectional planes can have the same shape at any position in the light emitting element 180.

Also, the light-emitting element 180 has third lateral surface including four surfaces Ts1, Ts2, Ts3, and Ts4 that exist between the first main surface 180*a* and the second main surface 180b and disposed between the first lateral surface Ps and the second lateral surface Ss. The third lateral surface Ts1, Ts2, Ts3, and Ts4 is surfaces constituting the third recess 180j, and are bent with respect to a direction from the first lateral surface Ps to the second lateral surface Ss and a direction from the first main surface 180a to the second main surface 180b to form respective surfaces. Furthermore, the light-emitting element 180 has fourth lateral surface including four surfaces Fs1, Fs2, Fs3, and Fs4 parallel to the third lateral surface including four surfaces Ts1, Ts2, Ts3, and Ts4, respectively. The fourth lateral surface Fs1, Fs2, Fs3, and Fs4 is surfaces constituting the third protrusion 180k, and are bent with respect to the direction from the first lateral surface Ps to the second lateral surface Ss and the direction from the first main surface 180a to the second main surface 180b to form respective surfaces.

The third lateral surface Ts1 and Ts2, and Ts3 and Ts4, and the fourth lateral surface Fs1 and Fs2, and Fs3 and Fs4, respectively, are arranged so as to be approximately symmetrical with respect to a plane perpendicular to the first main surface 180a and extends through the third recess 180j and the third protrusion 180k. The third lateral surface Ts1 and Ts3, and Ts2 and Ts4, and the fourth lateral surface Fs1 and Fs3, and Fs2 and Fs4 are arranged so as to be approximately symmetrical with respect to a plane perpendicular to the first lateral surface Ps that extends through the fourth recess 180q and the fourth protrusion 180r.

In the light-emitting element 180, the fourth lateral surface Fs1, Fs2, Fs3, and Fs4 opposite to four surfaces Ts1 and Ts2, and Ts3 and Ts4 of the third lateral surface defining the third recess 180j, the first lateral surface Ps that is adjacent to the first main surface 180a, the second main surface 180b, and the third lateral surface Ts1 and Ts3, the second lateral surface Ss opposite to the first lateral surface Ps, and the first main surface 180a are covered by the first light reflecting member. Also, the second main surface 180b is covered by the second light reflecting member. Accordingly, the third lateral surface Ts1, Ts2, Ts3, and Ts4 on the side of the third recess 180j and the fourth recess 180q serve as the light extraction surface. The configuration of the light-emitting element 180 is substantially similar to that of the light-emitting element 60 according to the sixth embodiment except for the configuration described above. Accordingly, the light-emitting element 180 exhibits similar effect to that of the light-emitting element 60.

Nineteenth Embodiment

In a light-emitting element 190 according to the present embodiment, as illustrated in FIG. 19, a plurality of light transmissive substrates 191 and a plurality of semiconductor layered bodies 192, each of which is disposed on each of the light transmissive substrate 191 and includes the active layer, are alternately stacked. In the present embodiment, a main surface of the light transmissive substrate 191 serve as an end surface of the light-emitting element 190 is referred to as a first main surface 190a, and a main surface of the semiconductor layered body 192 serves as another end surface of the light-emitting element 190 is referred to as a second main surface 190b. A cross-sectional plane parallel to the first main surface 190a and the second main surface 190b has the third concave figure that includes a third recess 190j and that includes a third protrusion 190k opposite to the third recess 190j. Cross-sectional planes parallel to the first main surface 190a and the second main surface 190b each has a shape of a parallel hexagon.

The light-emitting element 190 includes the first lateral surface Ps and the second lateral surface Ss, each of which is one lateral surface adjacent to the first main surface 190a and the second main surface 190b. A cross-sectional plane perpendicular to the first main surface 190a and intersects with the third lateral surface and the fourth lateral surface, that is, a cross-sectional plane parallel to the first lateral surface Ps and the second lateral surface Ss has the fourth concave figure having a fourth recess 190q, and that the fourth concave figure has a fourth protrusion 190r opposite to the fourth recess 190q. In this case, the fourth recess 190q has an inner angle of 270 degrees, and the fourth protrusion 190r has an inner angle of 90 degrees. Cross-sectional planes parallel to the first lateral surface Ps and the second lateral surface Ss each has a parallel hexagon, and all of these cross-sectional planes have the same shape at any position in the light emitting element 190.

Also, the light-emitting element 190 has third lateral surface including four surfaces Ts1, Ts2, Ts3, and Ts4 that exist between the first main surface 190a and the second main surface 190b and disposed between the first lateral surface Ps and the second lateral surface Ss. The third lateral surface Ts1, Ts2, Ts3, and Ts4 are surfaces constituting the third recess 190j, and are bent with respect to the direction from the first lateral surface Ps to the second lateral surface Ss and in the direction from the first main surface 190a to the second main surface 190b to form respective surfaces. Furthermore, the light-emitting element 190 has fourth lateral surface including four surfaces Fs1, Fs2, Fs3, and Fs4 parallel to the four surfaces of the third lateral surface Ts1, Ts2, Ts3, and Ts4, respectively. The fourth lateral surface Fs1, Fs2, Fs3, and Fs4 are surfaces defining the third protrusion 190k, and bent with respect to the direction from the first lateral surface Ps to the second lateral surface Ss and the direction from the first main surface 190a to the second main surface 190b to form respective surfaces.

The third lateral surface Ts1 and Ts2, and Ts3 and Ts4, and the fourth lateral surface Fs1 and Fs2, and Fs3 and Fs4, respectively, are arranged so as to be approximately symmetrical with respect to a plane perpendicular to the first main surface 190a that extends through the third recess 190j and the third recess 190k. The third lateral surface Ts1 and Ts3, and Ts2 and Ts4, and the fourth lateral surface Fs1 and Fs3, and Fs2 and Fs4, respectively, are arranged so as to be approximately symmetrical with respect to a plane perpendicular to the first lateral surface Ps that extends through the fourth recess 190q and the fourth protrusion 190r.

In the light-emitting element 190, the fourth lateral surface Fs1, Fs2, Fs3, and Fs4 opposite to the four surfaces Ts1, Ts2, Ts3 and Ts4 of the third lateral surface defining the third recess 190j, the first lateral surface Ps that is adjacent to the first main surface 190a and the third lateral surface Ts1 and Ts3, the second lateral surface Ss opposite to the first lateral surface Ps, and the first main surface 190a are covered by the first light reflecting member. Also, the second main surface 190b is covered by the second light reflecting member. Accordingly, the third lateral surface Ts1, Ts2, Ts3, and Ts4 on the side of the third recess 190j and the fourth protrusion 190r serve as light extraction surfaces. The configuration of the light-emitting element 190 is substantially similar to that of the light-emitting element 40 of the fourth embodiment except for the configuration described above. Accordingly, the light-emitting element 190 exhibits an effect similar to that of the light-emitting element 40 or the like.

Twentieth Embodiment

Figure 20:
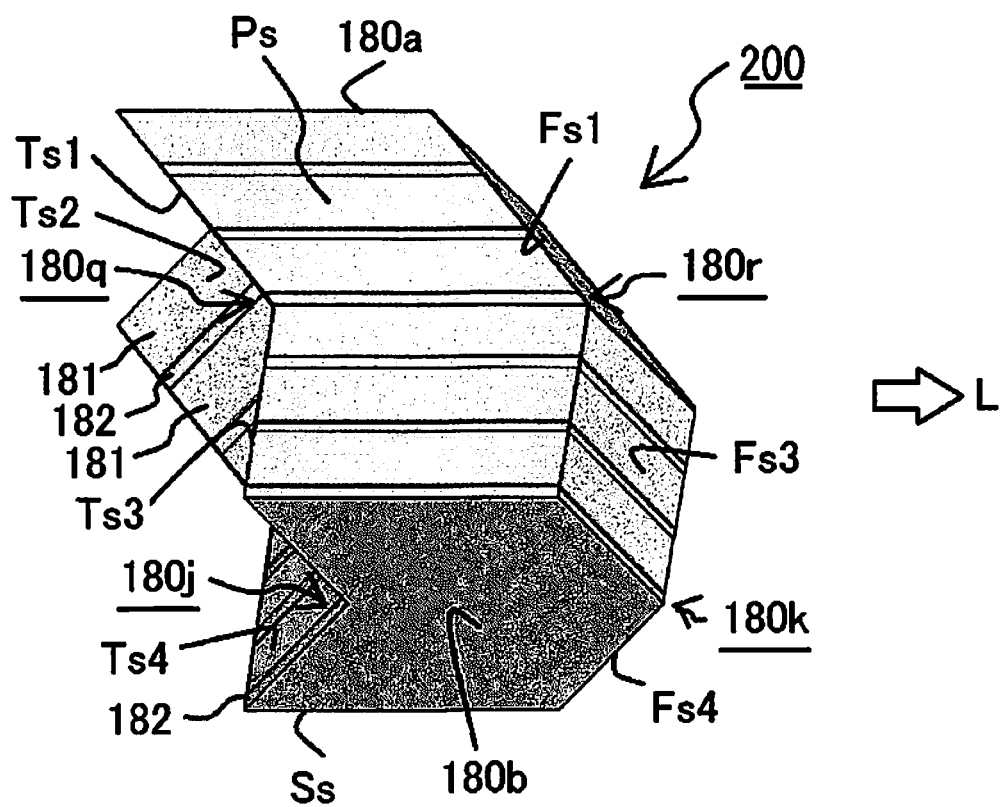
FIG. 20 is a schematic perspective view of the light-emitting element according to a twentieth embodiment of the present invention.

In a light-emitting element 200 according to the present embodiment, as illustrated in FIG. 20, the configuration of a light transmissive substrate 181 and the semiconductor layered body 182 is substantially the same with that of the light-emitting element 180 according to the eighteenth embodiment, and the light-emitting element 200 has a configuration such that the first light reflecting member is not formed on the fourth lateral surface Fs1, Fs2, Fs3, and Fs4 but formed on the third lateral surface Ts1, Ts2, Ts3, and Ts4, and light is extracted in a direction indicated by the arrow L from the side of third protrusion 180k and the fourth protrusion 180r. The light-emitting element 200 essentially has the fourth protrusion 180r, and a cross-sectional plane parallel to a main surface of the light transmissive substrate 181 has a third shape that has the third protrusion 180k, and the fourth lateral surface Fs1, Fs2, Fs3, and Fs4 includes one or more surfaces defining the third protrusion 180k.

With this constitution, the light-emitting element 200 can exhibit an effect similar to that of the light-emitting element 70 according to the seventh embodiment.

INDUSTRIAL APPLICABILITY

The light-emitting element according to the present invention can be employed for a light source for coupling with a light guiding plate or an optical fiber, a light source of backlight devices for a liquid crystal display panel, which is a thin-type light source, and a light source for illumination of a bulletin board or a cove lighting. Also, the light-emitting element can be employed for a light source with high power, high brightness, and high uniformity ratio of illumination, in place of mercury lamps or various kinds of fluorescent lamps, which have been conventionally used in ultraviolet ray irradiators for industrial use.

What is claimed is:

1. A light-emitting element comprising:
a light transmissive substrate having a first main surface, a second main surface opposite to the first main surface, a first lateral surface adjacent to the first main surface and the second main surface, a second lateral surface opposite to the first lateral surface, a third lateral surface adjacent to the second lateral surface, and a fourth lateral surface opposite to the third lateral surface;
a semiconductor layered body formed on the first main surface of the light transmissive substrate;
a first light reflecting member covering the first lateral surface, the second lateral surface, the fourth lateral surface, and the second main surface of the light transmissive substrate; and
a second light reflecting member covering a surface of the semiconductor layered body that is opposite from a surface on which the light transmissive substrate is disposed, wherein,
in the light transmissive substrate, a cross-sectional plane of the light transmissive substrate that is perpendicular to the first main surface and intersects with the third lateral surface and the fourth lateral surface has a first concave figure having a first recess, the deepest portion of the first recess is arranged on an inner side of an outer periphery of the semiconductor layered body, and the third lateral surface includes one or more surfaces defining the first recess.

2. The light-emitting element according to claim 1, wherein
the first concave figure is a shape that allows a tessellation in which multiple repetitions of the shape are closely fitted together in a planar configuration.

3. The light-emitting element according to claim 2, wherein
a cross-sectional plane of the light transmissive substrate parallel to the first main surface has a second concave figure having one or more second recesses, and
the second concave figure is a shape that allows a tessellation in which multiple repetitions of the shape are closely fitted together in a planar configuration.

4. The light-emitting element according to claim 1, wherein
the number of the first recess is one.

5. The light-emitting element according to any one of claim 1, wherein
a cross-sectional plane of the light transmissive substrate parallel to the first main surface has a second concave figure having one or more second recesses.

6. The light-emitting element according to claim 5, wherein
the second concave figure is a shape that allows a tessellation in which multiple repetitions of the shape are closely fitted together in a planar configuration.

7. The light-emitting element according to claim 5, wherein
the third lateral surface includes the one or more surfaces defining the first recess and the second recess.

8. The light-emitting element according to claim 5, wherein
the fourth lateral surface includes the one or more surfaces defining the second recess.

9. The light-emitting element according to claim 5, wherein
the second recess has a reentrant angle.

10. The light-emitting element according to claim 9, wherein
the second concave figure is a concave polygon.

11. The light-emitting element according to claim 10, wherein
the second concave figure is a parallel hexagon.

12. The light-emitting element according to claim 1, wherein
the first recess has a reentrant angle.

13. The light-emitting element according to claim 12, wherein
the first concave figure is a concave polygon.

14. The light-emitting element according to claim 13, wherein
the first concave figure is a parallel hexagon.

15. The light-emitting element according to claim 1, wherein
a distance between an outermost portion of the third lateral surface and the deepest portion of the first recess is in a range of 28% to 86% of a thickness of the light-transmissive substrate.

* * * * *